(12) United States Patent
Komuro et al.

(10) Patent No.: US 6,746,878 B2
(45) Date of Patent: Jun. 8, 2004

(54) SEMICONDUCTOR DEVICE AND METHOD OF MANUFACTURING THE SAME

(75) Inventors: Genichi Komuro, Kawasaki (JP); Kenkichi Suezawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/352,930

(22) Filed: Jan. 29, 2003

(65) Prior Publication Data

US 2003/0173605 A1 Sep. 18, 2003

(30) Foreign Application Priority Data

Mar. 15, 2002 (JP) ........................................ 2002-072199

(51) Int. Cl.[7] .............................................. H01L 21/00
(52) U.S. Cl. .......................... 438/3; 438/240; 438/244; 438/253; 438/387; 438/396; 257/68; 257/71; 257/295; 257/296; 257/306
(58) Field of Search ..................... 438/3, 240; 257/68, 257/71, 295–314, 324–326

(56) References Cited

U.S. PATENT DOCUMENTS 6,162,649 A * 12/2000 Kweon et al. ................. 438/3
6,169,009 B1    1/2001 Ju et al.
6,611,014 B1 *  8/2003 Kanaya et al. ............... 257/295
6,642,564 B2 * 11/2003 Ogawa et al. ............... 257/296

FOREIGN PATENT DOCUMENTS

JP          11-354510         12/1999

* cited by examiner

Primary Examiner—David Nelms
Assistant Examiner—Andy Huynh
(74) Attorney, Agent, or Firm—Westerman, Hattori, Daniels & Adrian, LLP

(57) ABSTRACT

There are provides the steps of forming sequentially a first conductive film, a dielectric film, and a second conductive film on an insulating film, forming a first film on the second conductive film, forming a second film made of insulating material on the first film, forming hard masks by patterning the second film and the first film into a capacitor planar shape, etching the second conductive film and the dielectric film in a region not covered with the hard masks, etching the first conductive film in the region not covered with the hard masks up to a depth that does not expose the insulating film, removing the second film constituting the hard masks by etching, etching a remaining portion of the first conductive film in the region not covered with the hard masks to the end, and removing the first film.

24 Claims, 16 Drawing Sheets

① BEFORE PROCESS
② AFTER PROCESS

SEMICONDUCTOR DEVICE AND METHOD OF MANUFACTURING THE SAME

CROSS-REFERENCE TO RELATED APPLICATIONS

This application is based upon and claims priority of Japanese Patent Application No. 2002-072199, filed on Mar. 15, 2002, the contents being incorporated herein by reference.

BACKGROUND OF THE INVENTION

1. Field of the Invention

The present invention relates to a semiconductor device and a method of manufacturing the same and, more particularly, a semiconductor device having capacitors over a semiconductor substrate and a method of manufacturing the same.

2. Description of the Prior Art

In recent years, the semiconductor memory using the ferroelectric capacitor and the high-dielectric capacitor is regarded as the promising one. For example, the ferroelectric capacitor is formed by the steps described in the following.

First, as shown in FIG. 1A, the first metal layer 106, the PZT layer 107, and the second metal layer 108 are formed sequentially on the interlayer insulating film 104 for covering the semiconductor substrate 101. In this case, the impurity diffusion region 103 surrounded by the element isolation insulating film 102 is formed on the semiconductor substrate 101, and the conductive plug 105 is formed in the interlayer insulating film 104 on the impurity diffusion region 103.

Then, the titanium nitride layer 110 and the silicon oxide layer 111 are formed sequentially on the second metal layer 108. Then, the silicon oxide layer 111 and the titanium nitride layer 110 are patterned by the photolithography method to be left over the conductive plug 105 as the hard mask 112 having the capacitor planar shape.

Then, as shown in FIG. 1B, the second metal layer 108, the PZT layer 107, and the first metal layer 106 in the region, which is not covered with the hard mask 112, are etched sequentially. Thus, the stacked ferroelectric capacitor 113 is formed on the interlayer insulating film 104.

Then, as shown in FIG. 1C, the silicon oxide layer 111 constituting the hard mask 112 is removed, and then the titanium nitride layer 110 is removed by changing the etchant.

As described above, the reason why not the resist mask but the hard mask 112 is employed to pattern the first metal layer 106, the PZT layer 107, and the second metal layer 108 is given as follows.

That is, in order to form the stacked ferroelectric capacitor 113, if the first metal layer 106, the PZT layer 107, and the second metal layer 108 are etched successively by using the resist mask, such resist mask disappears during the etching since the resist mask has the poor etching selectivity against these layers 106, 107, 108.

Meanwhile, it is set forth in U.S. Pat. No. 6,169,009 (Patent Application Publication (KOKAI) Hei 11-354510) that the hard mask having the above double-layered structure is used to pattern the metal film and the mixed gas consisting of chlorine, oxygen, and argon is used as the etching gas. Also, it is set forth in Patent Application Publication (KOKAI) Hei 11-354510 that the $SiO_2$ film in the hard mask disappears in the middle of the etching of the metal film.

It is preferable that the silicon oxide layer should be employed as the hard mask in patterning the PZT layer that is put between the first and second metal layers. Thus, the disappearance of the silicon oxide layer serving as the hard mask during the etching of the PZT layer causes the remarkable reduction in the etching rate of the PZT layer. Therefore, it is important to leave the silicon oxide layer 111 as the hard mask until the etching of the PZT layer is ended.

Accordingly, as shown in FIG. 1B, not only the titanium nitride layer 110 constituting the hard mask 112 but also the silicon oxide layer 111 is left on the second metal layer 108 in the state after the etching of the second metal layer 108, the PZT layer 107, and the first metal layer 106 are ended.

The silicon oxide layer 111 and the titanium nitride layer 110 are removed by the etching after the formation of the capacitor 113 is completed.

However, when the $SiO_2$ layer 111 constituting the hard mask 112 is removed, the interlayer insulating film 104 formed of the silicon oxide is also etched around the capacitor 113. Thus, the level difference between the capacitor 113 and the periphery area is increased. If such level difference is increased, such a disadvantage is caused that the filling property of the second-layer interlayer insulating film between plural capacitors 112 becomes worse.

SUMMARY OF THE INVENTION

It is an object of the present invention to provide a semiconductor device capable of making difficult the generation of reduction in thickness of an underlying insulating film when a hard mask used to form a capacitor is removed, and a method of manufacturing the same.

According to one aspect of the present invention, there is provided a semiconductor device comprising: an insulating film formed over a semiconductor substrate; capacitor lower electrodes formed on the insulating film and having discontinuous steps on side surfaces; capacitor dielectric films formed on the capacitor lower electrodes and having side surfaces that continue to upper side surfaces of capacitors; and capacitor upper electrodes formed on the capacitor dielectric films and having side surfaces that continue to side surfaces of the capacitor dielectric films.

Also, the above subject of the present invention can be overcome by providing a semiconductor device manufacturing method which comprises the steps of forming an insulating film over a semiconductor substrate; forming sequentially a first conductive film, a dielectric film, and a second conductive film on the insulating film; forming a first film made of metal or metal compound on the second conductive film; forming a second film made of insulating material on the first film; forming hard masks by patterning the second film and the first film into a capacitor planar shape; forming capacitor upper electrodes by etching the second conductive film in a region that is not covered with the hard masks; forming capacitor dielectric films by etching the dielectric film in the region that is not covered with the hard masks; etching the first conductive film in the region that is not covered with the hard masks up to a depth that does not expose the insulating film; removing the second film constituting the hard masks by etching; forming capacitor lower electrodes by etching a remaining portion of the first conductive film in the region, that is not covered with the hard masks, to the end; and removing the first film constituting the hard masks by the etching.

In addition, the above subject of the present invention can be overcome by providing a semiconductor device manufacturing method which comprises the steps of forming an insulating film over a semiconductor substrate; forming sequentially a first conductive film, a dielectric film, and a second conductive film on the insulating film; forming a first film made of metal or metal compound on the second conductive film; forming a second film made of a silicon nitride film, which is different material from the insulating film, on the first film; forming hard masks by patterning the second film and the first film into a capacitor planar shape; forming capacitor upper electrodes by etching the second conductive film in a region that is not covered with the hard masks; forming capacitor dielectric films by etching the dielectric film in the region that is not covered with the hard masks; forming capacitor lower electrodes by etching the first conductive film in the region that is not covered with the hard masks; removing the second film constituting the hard masks by etching using an etching gas containing fluorine and nitrogen; and removing the first film constituting the hard masks by the etching.

According to the present invention, the insulating material is employed as the uppermost layer of the hard mask that is used to pattern the first conductive film, the dielectric film, and the second conductive film formed on the insulating film. Then, removal of the uppermost layer is executed by interrupting the etching of the first conductive film, and then the etching of the first conductive film is started once again.

Therefore, in case the uppermost insulating layer constituting the hard mask is removed by the etching, the underlying insulating film is never exposed. Thus, the etching of the underlying insulating film of the capacitor can be suppressed.

Also, the deposition products that are adhered onto side walls of the hard mask by the etching of the dielectric film can be removed by the etching of the first conductive film applied before the uppermost layer of the hard mask is removed. Thus, removal of the uppermost layer of the hard mask can be facilitated.

In this case, according to two-step etching of the first conductive film, stepped portions are generated on side surfaces of the capacitor lower electrodes that are formed by patterning the first conductive film.

Also, according to the present invention, the uppermost layer of the hard mask is formed of the silicon nitride, and then the capacitor is formed by etching the first conductive film, the dielectric film, and the second conductive film continuously while using this hard mask.

Therefore, the uppermost insulating layer constituting the hard mask can be easily etched selectively to the insulating film after the capacitor is formed. Thus, the etching of the underlying insulating film of the capacitor can be suppressed.

DESCRIPTION OF THE PREFERRED EMBODIMENTS

Embodiments of the present invention will be explained with reference to the drawings hereinafter.
(First Embodiment)
FIGS. 2A to 2M are sectional views showing steps of manufacturing a semiconductor device according to a first embodiment of the present invention.

Figure 1A:
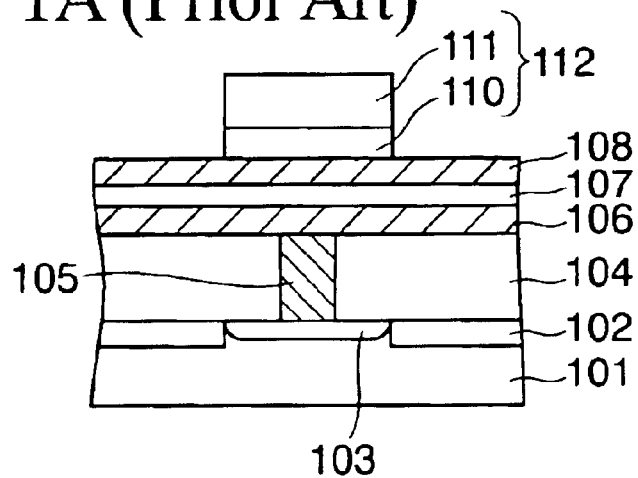
FIGS. 1A to 1C are sectional views showing steps of manufacturing the semiconductor device in the prior art.
Figure 1B:
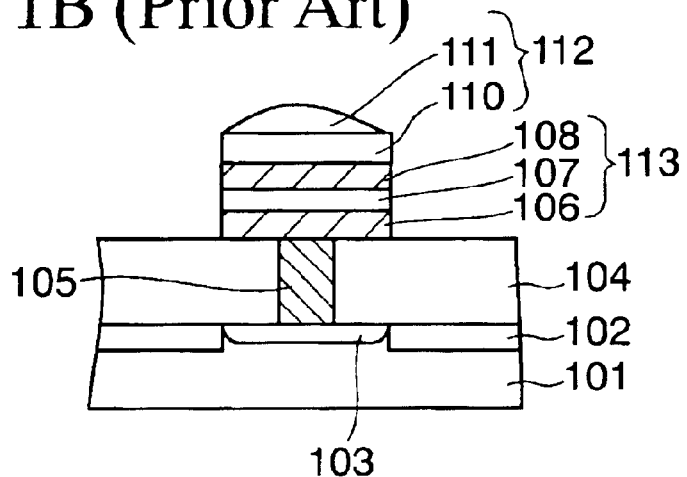
Figure 1C:
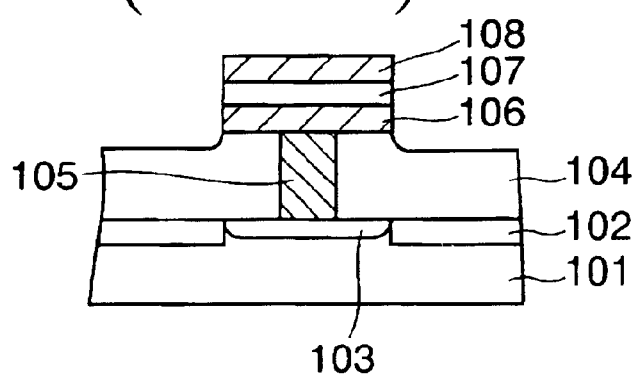
Figure 2A:
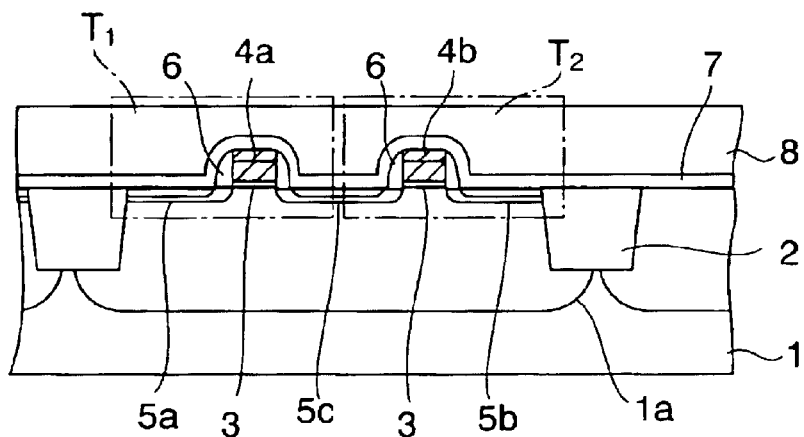
FIGS. 2A to 2M are sectional views showing steps of forming a semiconductor device according to a first embodiment of the present invention.

First, steps required until a sectional structure shown in FIG. 2A is formed will be explained hereunder.

As shown in FIG. 2A, an element isolation recess is formed around a transistor forming region of an n-type or p-type silicon (semiconductor) substrate 1 by the photolithography method. Then, an element isolation insulating film 2 is formed by burying silicon oxide ($SiO_2$) into the element isolation recess. The element isolation insulating film 2 having such structure is called STI (Shallow Trench Isolation). In this case, an insulating film formed by the LOCOS (Local Oxidation of Silicon) method may be employed as the element isolation insulating film.

Then, a p-well 1a is formed by introducing the p-type impurity into the transistor forming region of the silicon substrate 1. Then, a silicon oxide film as a gate insulating film 3 is formed by oxidizing thermally a surface of the transistor forming region of the silicon substrate 1.

Then, an amorphous silicon film or a polysilicon film and a tungsten silicide film are formed sequentially on an overall upper surface of the silicon substrate 1. Then, gate electrodes 4a, 4b are formed by patterning the silicon film and the tungsten silicide film by virtue of the photolithography method.

In this case, two gate electrodes 4a, 4b are formed in parallel on one p-well 1a. These gate electrodes 4a, 4b constitute a part of the word line.

Then, first to third n-type impurity diffusion regions 5a to 5c serving as the source/drain are formed by ion-implanting the n-type impurity into the p-well 1a on both sides of the gate electrodes 4a, 4b.

Then, an insulating film, e.g., a silicon oxide ($SiO_2$) film, is formed on an overall surface of the silicon substrate 1 by the CVD method. Then, insulating sidewall spacers 6 are left on both side portions of the gate electrodes 4a, 4b by etching back the insulating film.

Then, the n-type impurity is ion-implanted into the first to third n-type impurity diffusion regions 5a to 5c once again by using the gate electrodes 4a, 4b and the sidewall spacers 6 as a mask. Thus, the first to third n-type impurity diffusion regions 5a to 5c are formed into the LDD structure.

In this case, the first and second n-type impurity diffusion regions 5a, 5b positioned on both end sides of one p-well 1a are connected electrically to the lower electrodes of the capacitors, and the third n-type impurity diffusion region 5c positioned between two gate electrodes 4a, 4b is connected electrically to the bit line.

According to the above steps, two MOS transistors $T_1$, $T_2$ having the gate electrodes 4a, 4b and the n-type impurity diffusion regions 5a to 5c having the LDD structure are formed in the p-well 1a.

Then, a silicon oxide nitride (SiON) film of about 200 nm thickness is formed as a cover insulating film 7, which covers the MOS transistors $T_1$, $T_2$, on an overall surface of the silicon substrate 1 by the plasma CVD method. Then, a silicon oxide ($SiO_2$) film of about 1.0 μm is formed as a first interlayer insulating film 8 on the cover insulating film 7 by the plasma CVD method using the TEOS gas.

Then, as the densifying process of the first interlayer insulating film 8, the first interlayer insulating film 8 is annealed in the normal-pressure nitrogen atmosphere at the temperature of 700° C. for 30 minute, for example. Then, an upper surface of the first interlayer insulating film 8 is planarized by the CMP (Chemical Mechanical Polishing) method.

Figure 2B:
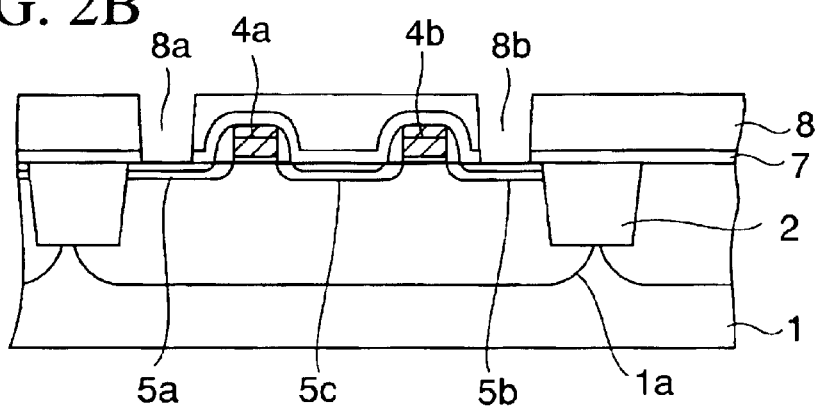

Then, as shown in FIG. 2B, first and second contact holes 8a, 8b that have a depth to reach the first and second n-type impurity diffusion regions 5a, 5b respectively are formed by patterning the first interlayer insulating film 8 and the cover insulating film 7 by virtue of the photolithography method.

Then, a titanium (Ti) film of about 30 nm thickness and a titanium nitride (TiN) film of about 50 nm thickness are formed sequentially as a glue film on an upper surface of the first interlayer insulating film 8 and inner surfaces of the first and second contact holes 8a, 8b by the sputter method. Then, a tungsten (W) film is grown on the TiN film by the CVD method using $WF_6$ to bury completely insides of the first and second contact holes 8a, 8b.

Figure 2C:
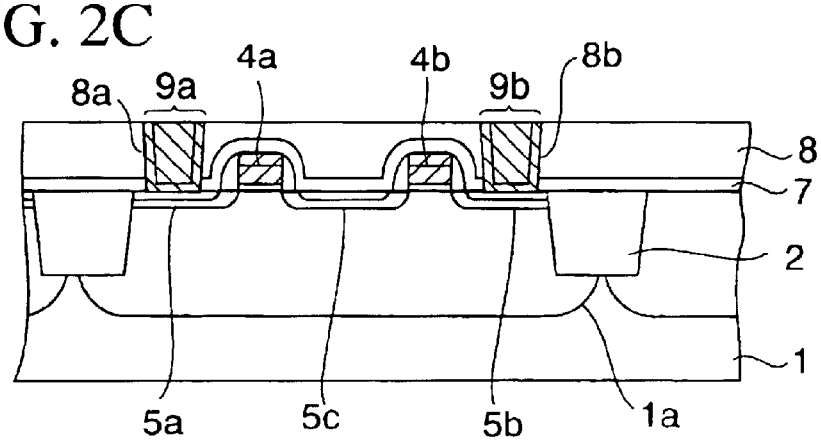

Then, as shown in FIG. 2C, the W film, the TiN film, and the Ti film are polished by the CMP method to remove from the upper surface of the first interlayer insulating film 8. The W film, the TiN film, and the Ti film being left in the first and second contact holes 8a, 8b are used as first and second conductive plugs 9a, 9b.

Figure 2D:
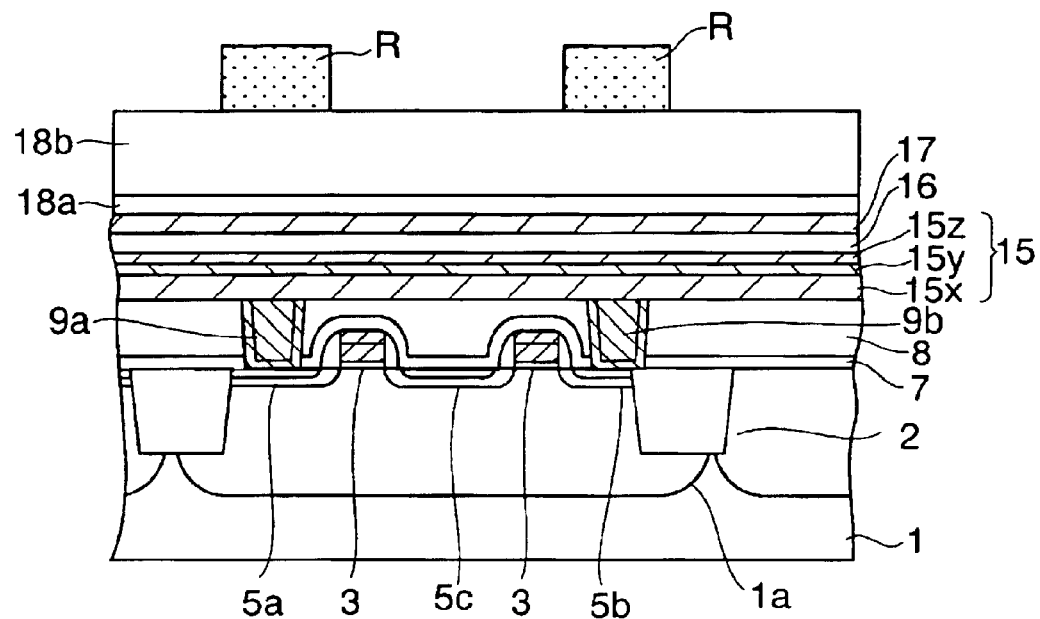

Next, steps required until a structure shown in FIG. 2D is formed will be explained hereunder.

First, an iridium (Ir) film 15x of about 200 nm thickness, an iridium oxide ($IrO_x$) film 15y of about 50 nm thickness, and a platinum (Pt) film 15z of about 100 nm thickness, for example, are formed sequentially as a first conductive film 15 on the first and second conductive plugs 9a, 9b and the first interlayer insulating film 8 by the sputter. The first conductive film 15 may be formed of a conductive film containing other platinum-group metal or platinum-group metal oxide.

In this case, the first interlayer insulating film 8 is annealed to prevent the film peeling-off, for example, before or after the first conductive film 15 is formed. As the annealing method, RTA (Rapid Thermal Annealing) executed in the argon atmosphere at 600 to 750° C. is employed.

Then, a PZT film of about 100 nm thickness, for example, is formed as a ferroelectric film 16 on the first conductive film 15 by the sputter method. As the method of forming the ferroelectric film 16, in addition to this, there are the MOD (Metal Organic Deposition) method, the MOCVD (Metal Organic CVD) method, the sol-gel method, etc. Also, as the material of the ferroelectric film 16, in addition to PZT, other PZT material such as PLCSZT, PLZT, etc., the Bi layered-structure compound material such as $SrBi_2Ta_2O_9$, $SrBi_2(Ta,Nb)_2O_9$, etc., other metal oxide ferroelectric substance, etc. may be employed.

Then, the ferroelectric film 16 is crystallized by executing the annealing in the oxygen atmosphere. As the annealing, two-step RTA process having the first step in which the annealing is executed in the mixed-gas atmosphere consisting of the argon and the oxygen at the substrate temperature of 600° C. for 90 second and the second step in which the annealing is executed in the oxygen atmosphere at the substrate temperature of 750° C. for 60 second, for example, is employed.

Then, a iridium oxide ($IrO_2$) film of about 200 nm thickness, for example, is formed as a second conductive film 17 on the ferroelectric film 16 by the sputter method.

Then, a TiN film 18a and a $SiO_2$ film (insulating film) 18b serving as a hard mask are formed sequentially on the second conductive film 17. The TiN film 18a is formed by the sputter method to have a thickness of about 200 nm, for example. The $SiO_2$ film 18b is formed by the plasma CVD method using TEOS (tetraethoxysilane) to have a thickness of about 800 nm, for example.

Then, resist R is coated on the $SiO_2$ film 18b, and then patterns are formed by exposing/developing this resist to have a capacitor planar shape over the first and second conductive plugs 9a, 9b respectively.

Then, the $SiO_2$ film 18b formed in the region that is not covered with the resist R is removed by the dry etching using $C_4F_8$, Ar, and $CF_4$ as the etching gas. Then, the TiN film 18a formed in the region that is not covered with the resist R is removed by the dry etching using $BCl_3$ and $Cl_2$ as the etching gas. The etching of the $SiO_2$ film 18b and the etching of the TiN film 18a are carried out by changing the etcher.

Figure 2E:
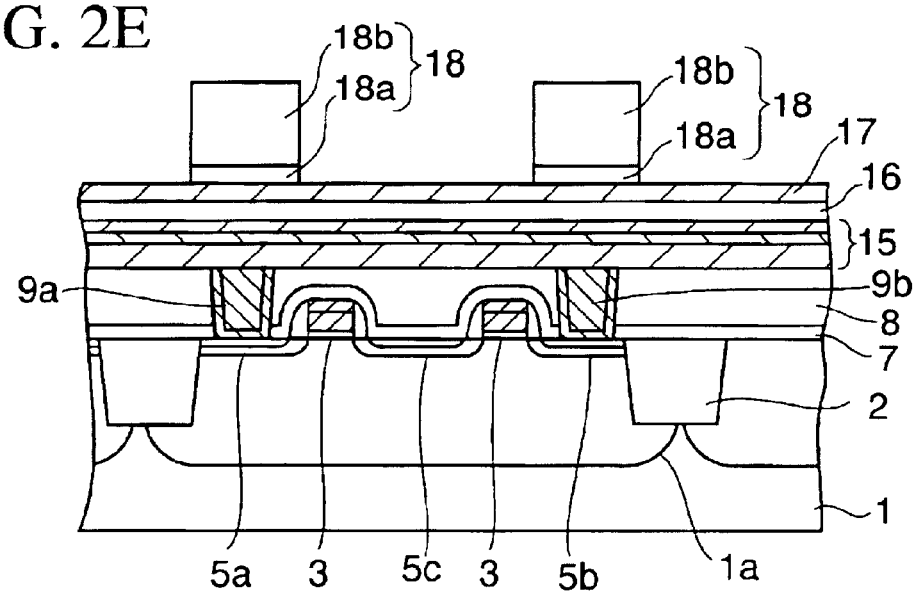

Then, as shown in FIG. 2E, the $SiO_2$ film 18b and the TiN film 18a, after patterned, are used as the hard mask 18. In this case, after the hard mask 18 is formed, the resist R is removed by the ashing.

Then, the second conductive film 17, the ferroelectric film 16, and the first conductive film 15 formed in the region that is not covered with the hard mask 18 are etched sequentially under the following conditions by using the ICP etching equipment.

First, the $IrO_x$ film as the second conductive film 17 is etched. As the etching conditions in this case, HBr and $O_2$ are supplied to the etching chamber at a flow rate of 10 sccm and a flow rate of 40 sccm respectively, the pressure in the chamber is set to 0.4 Pa, the wafer stage temperature is set to 400° C., the source power is set to 800 watt, and the bias power is set to 700 watt. Here, the source power is the power of the high-frequency power supply applied to the antenna of the ICP etching equipment, and the bias power is the power of the high-frequency power supply applied to the semiconductor wafer (silicon substrate 1). The etching of the second conductive film 17 is detected by using the end-point detector, and the over-etching is executed by about 10% of the film thickness of the second conductive film 17. In this case, the emission spectrophotometer is employed as the end-point detector, for example.

Then, the PZT film as the ferroelectric film 16 is etched. As the etching conditions in this case, $Cl_2$ and Ar are supplied to the etching chamber at a flow rate of 40 sccm and a flow rate of 10 sccm respectively, the pressure in the chamber is set to 0.4 Pa, the wafer stage temperature is set to 400° C., the source power is set to 800 watt, and the bias power is set to 700 watt. Also, the etching of the ferroelectric film 16 is detected by using the end-point detector, and the just-etching is executed.

It may be considered that, after the etching of the ferroelectric film 16 is ended, the $SiO_2$ film 18b constituting the hard mask 18 should be removed. However, since the products generated during the etching of the first conductive film 15 and the ferroelectric film 16 are deposited onto side surfaces of the SiO$_2$ film 18b as the noble metal deposition film, it is difficult to remove the SiO$_2$ film 18b as it is.

Figure 2F:
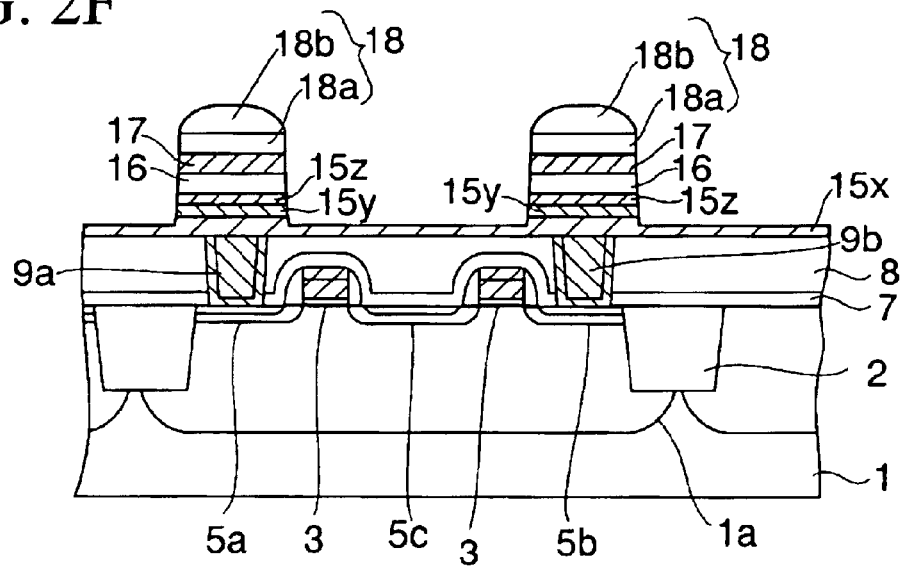

Therefore, as shown in FIG. 2F, the ferroelectric film 16 is etched while the SiO$_2$ film 18b as the upper layer portion of the hard mask 18 is still left, and subsequently the first conductive film 15 of the multi-layered structure is under-etched in the middle. This under-etching is the half-etching that is carried out until about 50% of the film thickness, for example.

The under-etching is carried out up to the middle of the etching process of the first conductive film 15. For example, this under-etching is carried out up to a depth that reaches the upper portion of the Ir film 15x after the etchings of the Pt film 15z and the IrO$_x$ 15y are ended. As the etching conditions in this case, HBr and O$_2$ are supplied to the etching chamber at a flow rate of 10 sccm and a flow rate of 40 sccm respectively, the pressure in the chamber is set to 0.4 Pa, the wafer stage temperature is set to 400° C., the source power is set to 800 watt, and the bias power is set to 700 watt.

Under such under-etching conditions, the noble metal deposition film is removed from side surfaces of the SiO$_2$ film 18b.

Figure 2G:
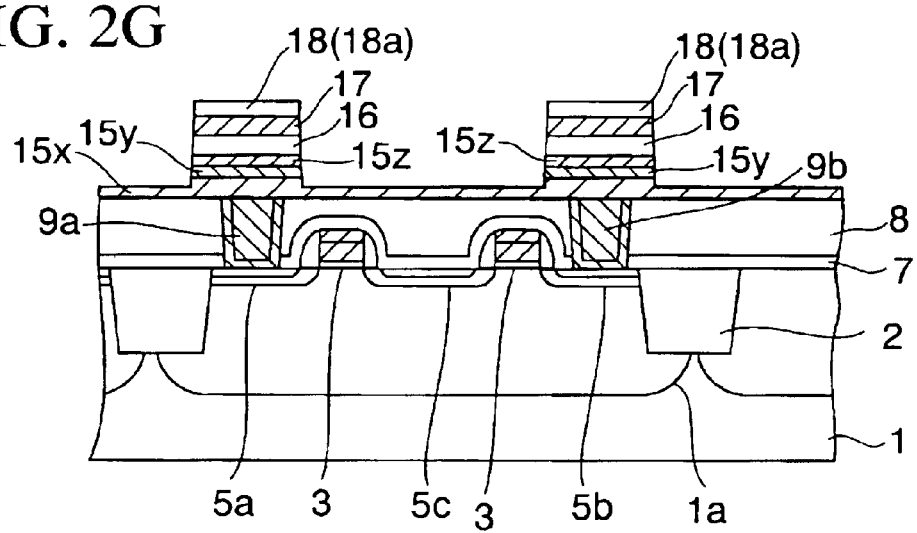

After the under-etching, the silicon substrate 1 is taken out from the ICP etching equipment and then put into the plasma etching equipment. Then, as shown in FIG. 2G, in the state that the silicon substrate 1 is cooled, the SiO$_2$ film 18b of the hard mask 18 is removed by the etching using the mixed gas consisting of CF$_4$, CHF$_3$, and Ar.

The polymer deposited product is produced at the time of the etching of the SiO$_2$ film 18b. This polymer deposited product remains on side surfaces of respective layers from the hard mask 18 to the first conductive film 15. If the polymer deposited product is formed thick, such deposited product functions as the etching mask. Therefore, such polymer deposited product is removed by using the ashing equipment using the oxygen-containing gas.

Figure 2H:
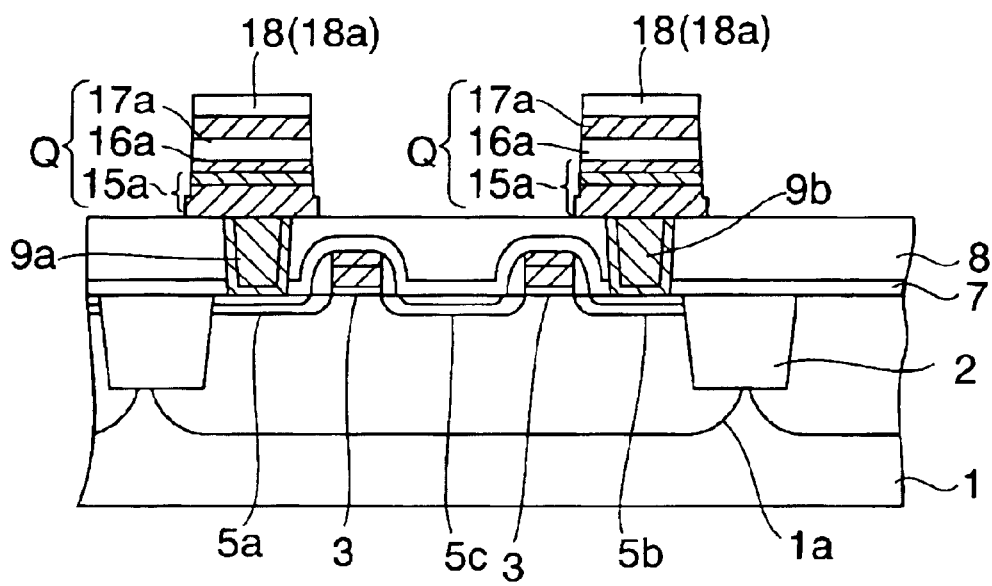

Then, the silicon substrate 1 is put back into the ICP etching equipment. Then, as shown in FIG. 2H, the etching of the first conductive film 15 is restarted by using the hard mask 18 that has a single-layer structure of the TiN film 18a. The etching conditions in this case are set identically to the etching conditions for the upper portion of the first conductive film 15, and the remaining portion of the first conductive film 15 is etched for a predetermined time. Accordingly, an upper surface of the first interlayer insulating film 8 is exposed.

In this manner, when the step of removing the SiO$_2$ film 18b of the hard mask 18 is inserted in the middle of the etching of the first conductive film 15, a discontinuous surface, a level difference, etc. are ready to appear on the side surfaces of the first conductive film 15. Such discontinuous surface or such level difference exerts no influence upon the capacitor characteristics.

As a result, two capacitors Q are formed on the first interlayer insulating film 8 over one p-well 1a. Each of the capacitors Q has a lower electrode 15a made of the first conductive film 15, a dielectric film 16a made of the ferroelectric film 16, and an upper electrode 17a made of the second conductive film 17. The lower electrodes 15a of the capacitors Q are connected to the first and second n-type impurity diffusion regions 5a, 5b via the first and second conductive plugs 9a, 9b respectively.

Figure 2I:
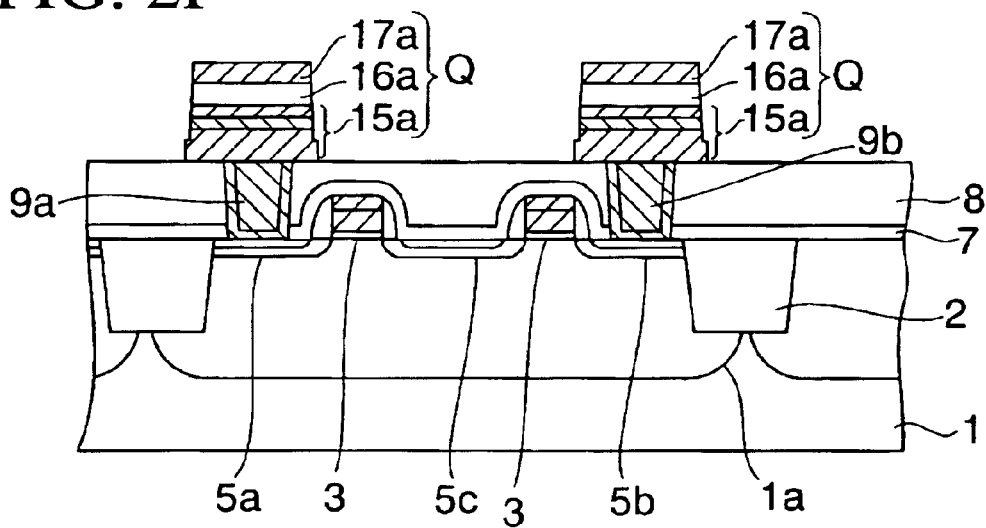

Then, as shown in FIG. 2I, the TiN film 18a being left as the hard mask 18 is removed. As the etching conditions of the TiN film 18a, it is preferable that the isotropic etching should be employed to enhance the etching selectivity to SiO$_2$ constituting the first interlayer insulating film 8. As the etching, for example, the dry process employing the down-flow etching using the etching gas containing CF$_4$ and O$_2$, or the wet process using the mixed solution of NH$_4$OH, H$_2$O$_2$, and H$_2$O is effective.

According to such etching conditions of the TiN film 18a, the selective etching of the TiN film 18a to the SiO$_2$ film can be executed. Thus, the first interlayer insulating film 8 around the capacitors Q is seldom etched and therefore no large recess is generated around the capacitors Q.

Then, in order to recover the ferroelectric film 16 from the damage caused by the etching, the recovery annealing of the capacitors Q is carried out. The recovery annealing in this case is carried out in the oxygen atmosphere at the substrate temperature of 650° C. for 60 minute, for example.

Figure 2J:
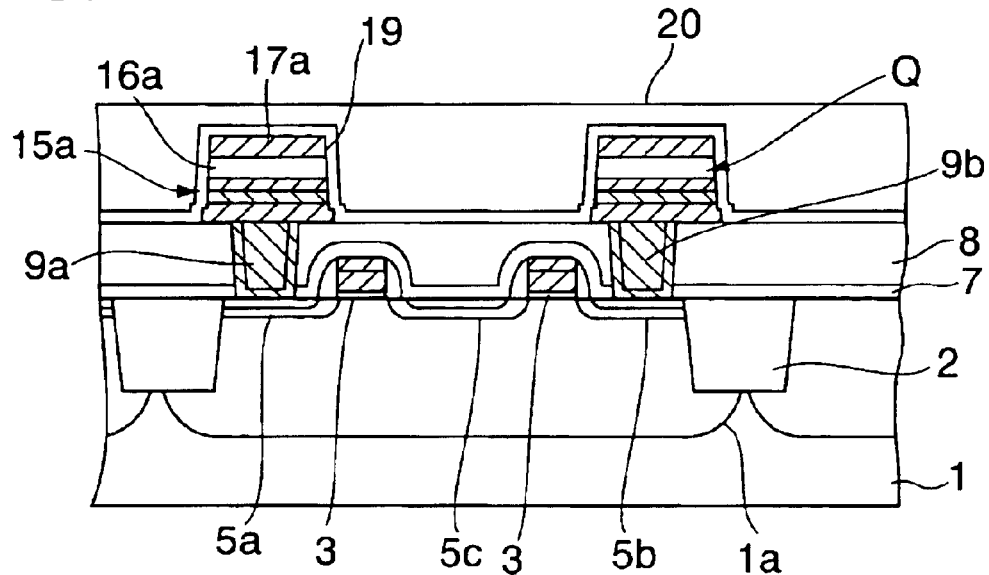

Then, as shown in FIG. 2J, an alumina film of 50 nm thickness is formed as a capacitor protection film 19 on surfaces of the capacitors Q and an underlying insulating film 10b by the sputter. Then, the capacitors Q are annealed in the oxygen atmosphere at 650° C. for 60 minute. The capacitor protection film 19 is formed to protect the capacitors Q from the process damage.

Then, a silicon oxide (SiO$_2$) film of about 1.0 μm thickness is formed as a second interlayer insulating film 20 on the capacitor protection film 19 by the plasma CVD method using the TEOS gas. Then, an upper surface of the second interlayer insulating film 20 is made flat by the CMP method. In this example, a remaining thickness of the second interlayer insulating film 20 after the CMP is set to about 300 nm on the upper electrode 17a of the capacitor Q.

Figure 2K:
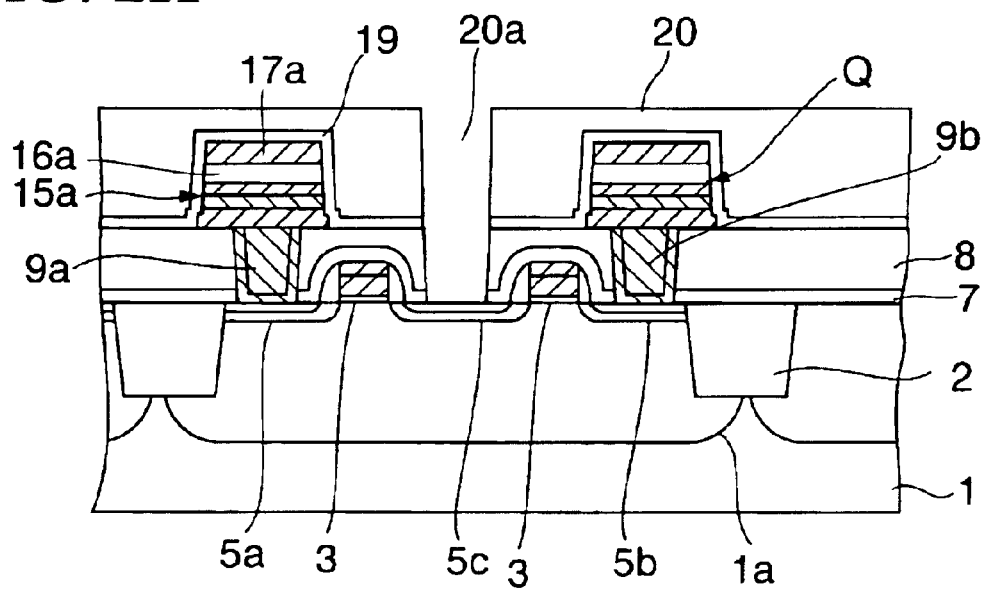

Then, as shown in FIG. 2K, the second interlayer insulating film 20, the capacitor protection film 19, the first interlayer insulating film 8, and the cover insulating film 7 are etched by using the resist mask (not shown). Thus, a third contact hole 20a is formed on the third n-type impurity diffusion region 5c.

Then, a Ti film of 30 nm and a TiN film of 50 nm thickness are formed in order as a glue film in the third contact hole 20a and on the second interlayer insulating film 20 by the sputter method. Then, a W film is grown on the glue film by the CVD method to bury completely the third contact hole 20a.

Figure 2L:
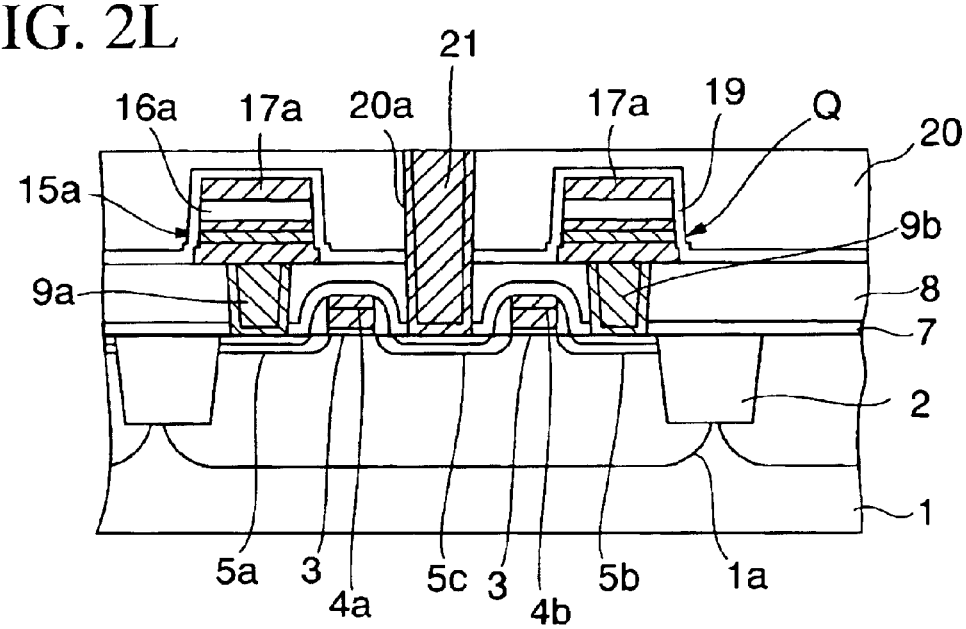

Then, as shown in FIG. 2L, the W film and the TiN film are polished by the CMP method to remove from an upper surface of the second interlayer insulating film 20. Then, the tungsten film and the glue film being left in the third contact hole 20a are used as a third conductive plug 21.

Figure 2M:
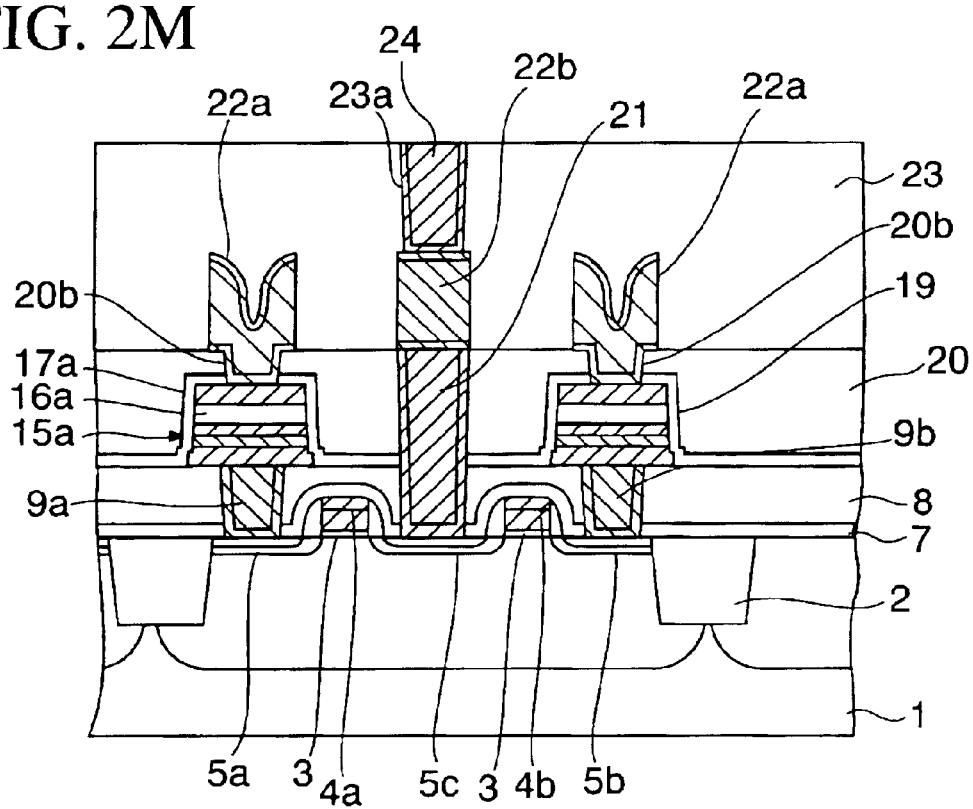

Next, steps required until a structure shown in FIG. 2M is formed will be explained hereunder.

First, an SiON film is formed as an oxidation preventing film (not shown) on the third conductive plug 21 and the second interlayer insulating film 20 by the CVD method. Then, contact holes 20b are formed on the upper electrodes 17a of the capacitors Q by patterning the oxidation preventing film and the second interlayer insulating film 20 by means of the photolithography method.

The capacitors Q that are subjected to the damage in forming the contact holes 20b can be recovered by the annealing. The annealing is carried out in the oxygen atmosphere at the substrate temperature of 550° C. for 60 minute, for example.

Then, the oxidation preventing film formed on the second interlayer insulating film 20 is removed by the etching-back to expose a surface of the third conductive plug 21.

Then, a multi-layered metal film is formed in the contact holes 20b formed on the upper electrodes 17a of the capacitors Q and on the second interlayer insulating film 20. Then, first-layer metal wirings 22a, which are connected to the upper electrodes 17a via the contact holes 20b, and a conductive pad 22b, which is connected to the third conductive plug 21, are formed by patterning the multi-layered metal film. As the multi-layered metal film, a structure in which a Ti film of 60 nm thickness, a TiN film of 30 nm thickness, an Al—Cu film of 400 nm thickness, a Ti film of 5 nm thickness, and a TiN film of 70 nm thickness are formed sequentially, for example, is employed.

In this case, as the method of patterning the multi-layered metal film, the method of forming a reflection preventing film (not shown) on the multi-layered metal film, then coating the resist (not shown) on the reflection preventing film, then forming resist patterns such as the wiring shape, etc. by exposing/developing the resist, and then etching the reflection preventing film and the multi-layered metal film by using the resist patterns is employed.

Then, a third interlayer insulating film 23 is formed on the second interlayer insulating film 20, the first-layer metal wirings 22a, and the conductive pad 22b. Then, a hole 23a is formed on the conductive pad 22b by patterning the third interlayer insulating film 23, and a fourth conductive plug 24 that consists of the TiN film and the W film sequentially from the bottom is formed in the hole 23a.

Then, although not particularly shown, second-layer wirings containing the bit line are formed on the third interlayer insulating film 23. The bit line is connected electrically to the third n-type impurity diffusion region 5c via the fourth conductive plug 24, the conductive pad 22b, and the third conductive plug 21. Subsequently to this, an insulating film for covering the second-layer wirings, etc. are formed, but their details will be omitted herein.

As described above, in the present embodiment, when the first conductive film 15, the ferroelectric film 16, and the second conductive film 17 are to be etched by using the same hard mask, the hard mask having the multi-layered structure is employed and also the $SiO_2$ film 18b is used as the uppermost layer. Then, the removal of the $SiO_2$ film 18b that is necessary for the etching of the ferroelectric film 16 is executed after the etching of the first conductive film 15 is temporarily interrupted.

Accordingly, when the uppermost $SiO_2$ film 18b of the hard mask 18 is removed, the first interlayer insulating film 8 is protected by the first conductive film 15 from the etching.

Also, since the first conductive film 15, which is etched finally by using the hard mask 18, is formed of the platinum-group metal or the platinum-group oxide, the first conductive film 15 can be etched selectively to the silicon compound insulating material constituting the first interlayer insulating film 8.

Meanwhile, the interruption timing of the etching of the first conductive film 15 is not limited to about 50% of the film thickness. However, it is preferable that the first conductive film 15 should be left to such extent that the first interlayer insulating film 8 is not exposed.

By the way, it may be considered that a film thickness of the $SiO_2$ film 18b should be adjusted such that the $SiO_2$ film 18b can be removed at a point of time when the etching of the first conductive film 15 is ended. However, as shown in FIG. 2F, the etching of the $SiO_2$ film 18b proceeds easily at the edge portion rather than the center portion, and thus it is difficult to adjust such film thickness. Also, it may be considered that the surface of the first interlayer insulating film 8 is composed of the silicon nitride. However, in such case, the film quality of the lower electrodes 15a of the capacitors Q is deteriorated, and thus there is caused another disadvantage such that the crystal of the ferroelectric film 16 is deteriorated.

In this case, the third contact hole 20a in which the third conductive plug 21 is buried is formed by etching the second interlayer insulating film 20 and the first interlayer insulating film 8 together. But such third contact hole 20a may be formed at two stages, as will be explained in a second embodiment.

(Second Embodiment)

Figure 3A:
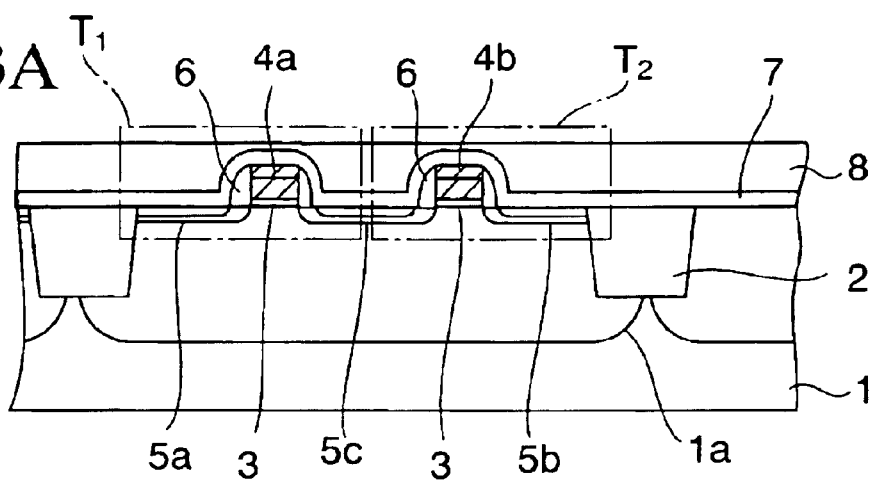
FIGS. 3A to 3N are sectional views showing steps of forming a semiconductor device according to a second embodiment of the present invention.
Figure 3B:
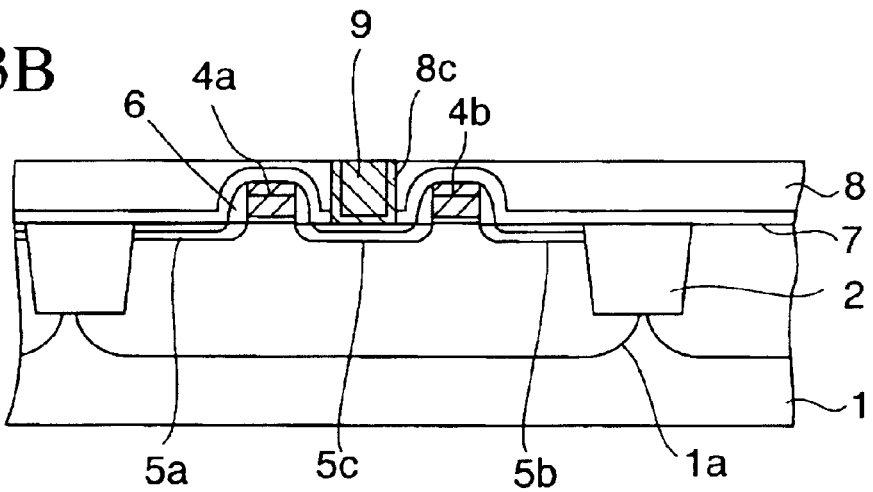
Figure 3C:
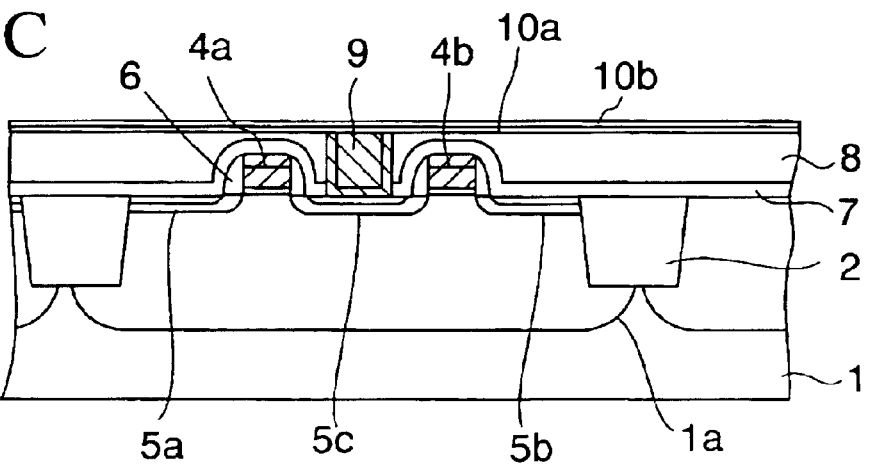
Figure 3D:
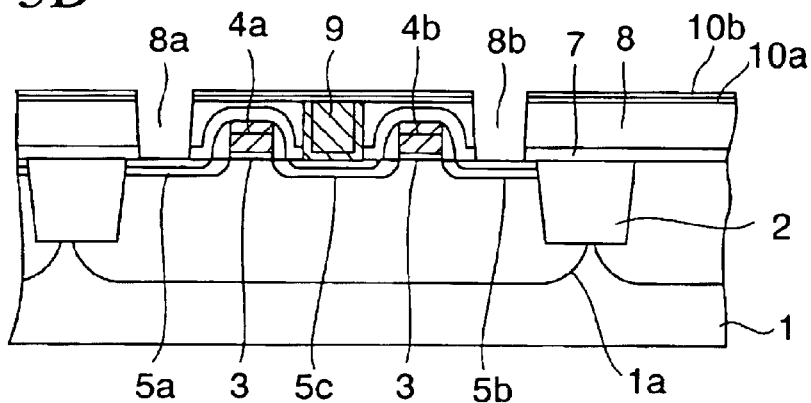
Figure 3E:
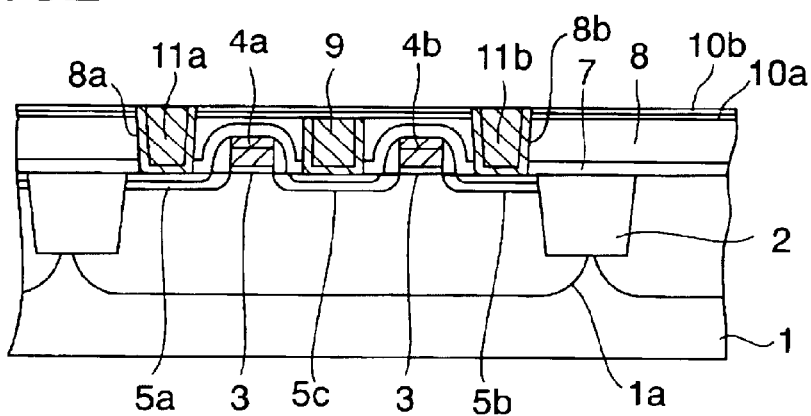
Figure 3F:
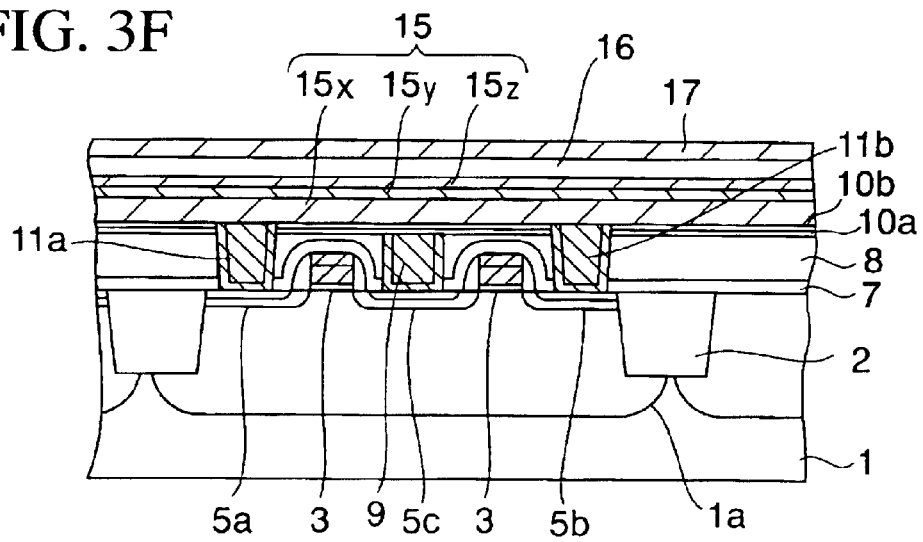
Figure 3G:
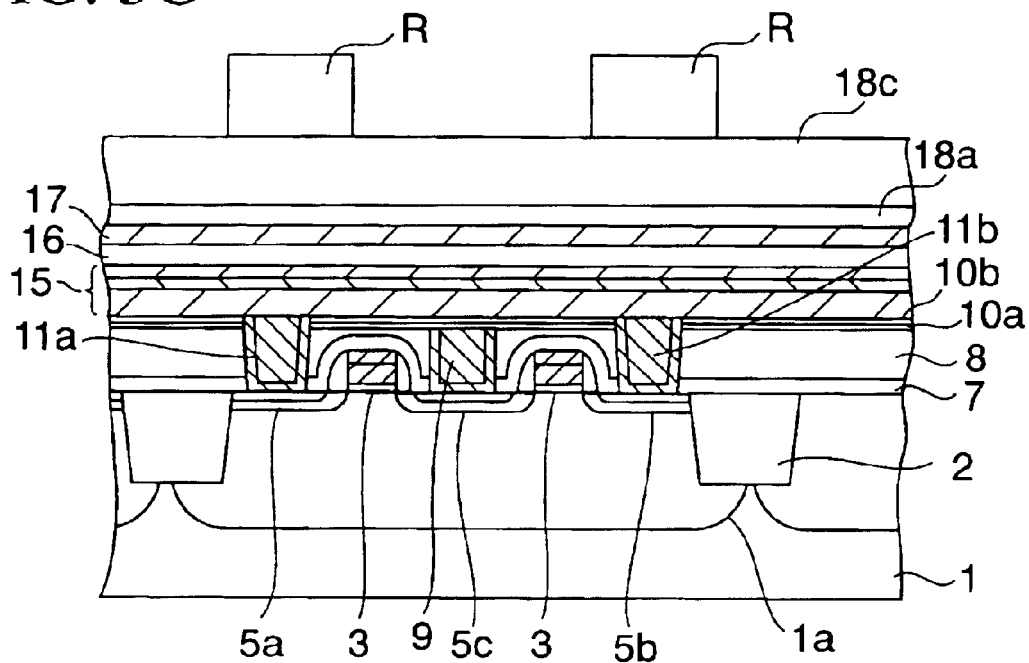
Figure 3H:
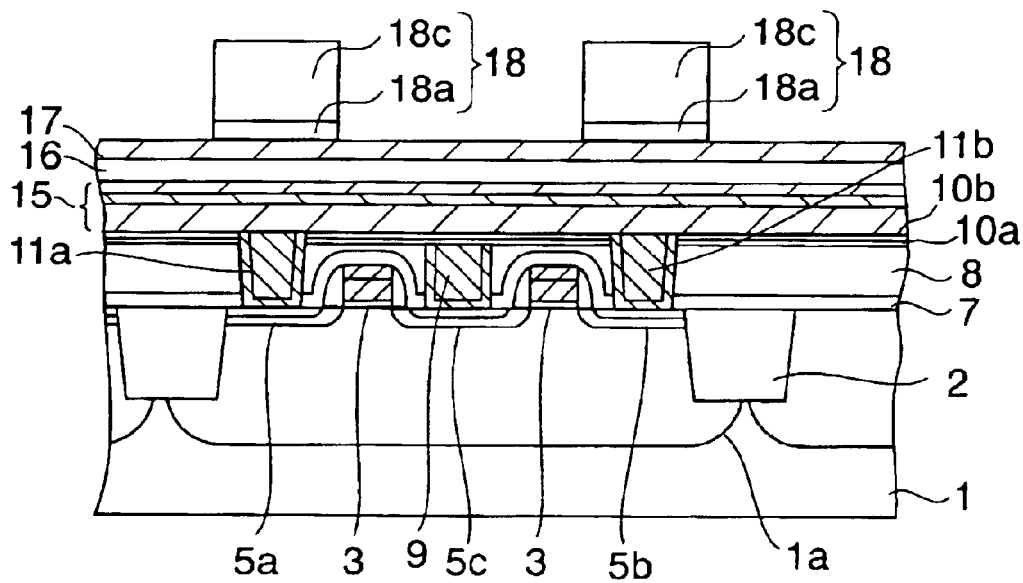
Figure 3I:
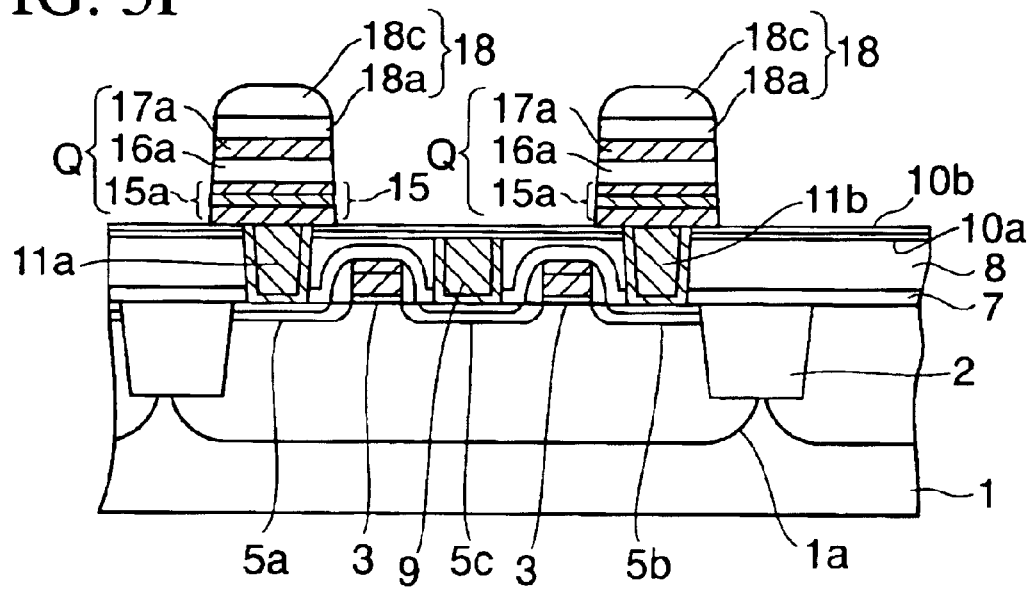
Figure 3J:
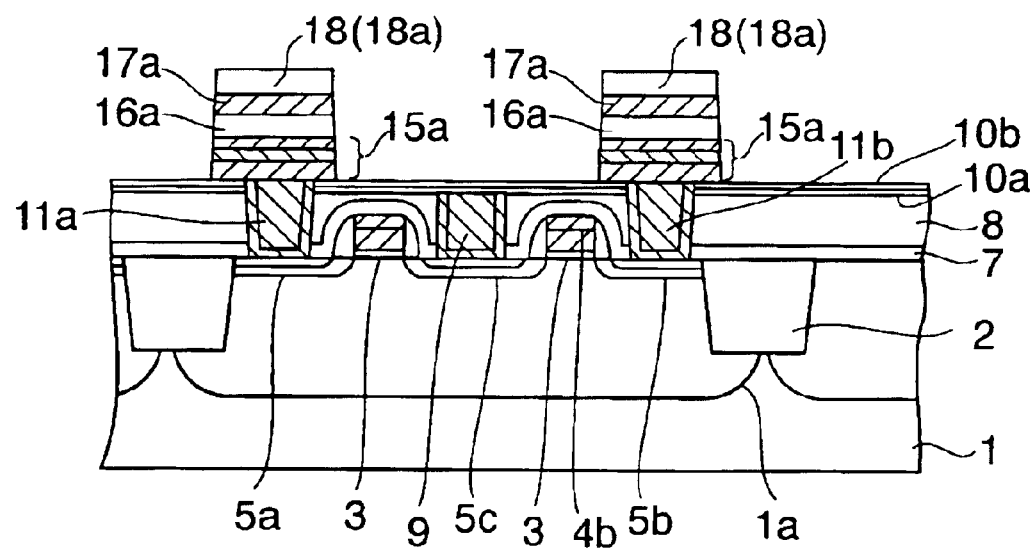
Figure 3K:
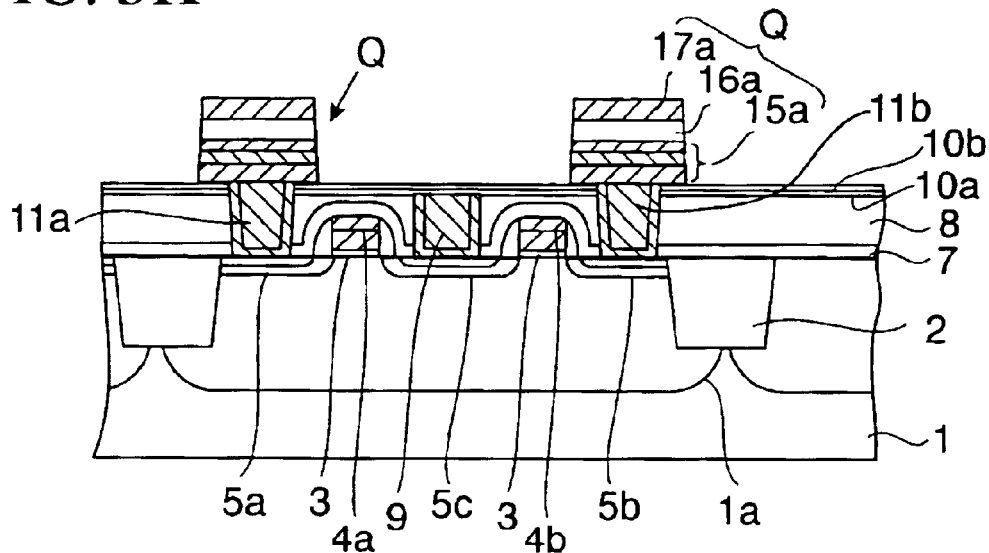
Figure 3L:
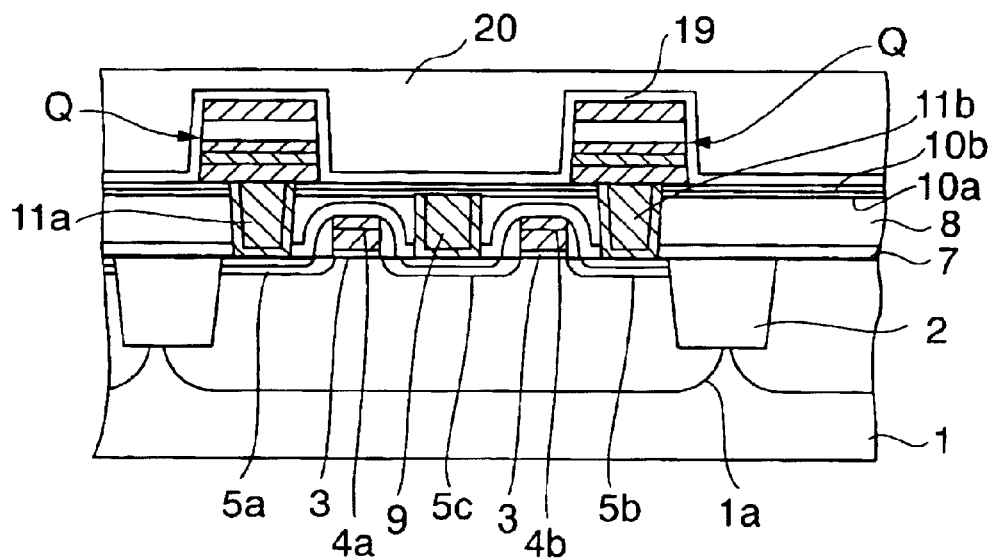
Figure 3M:
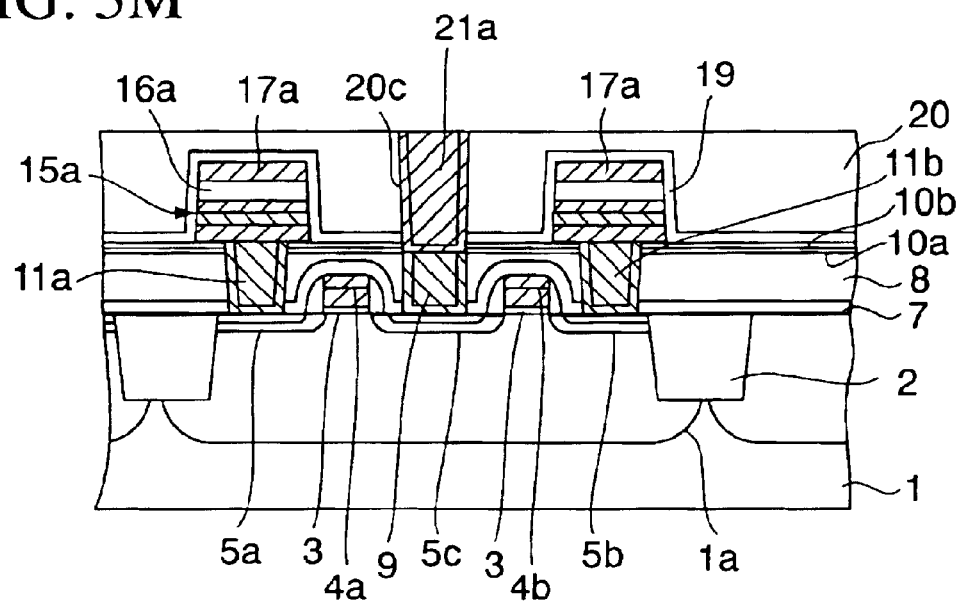
Figure 3N:
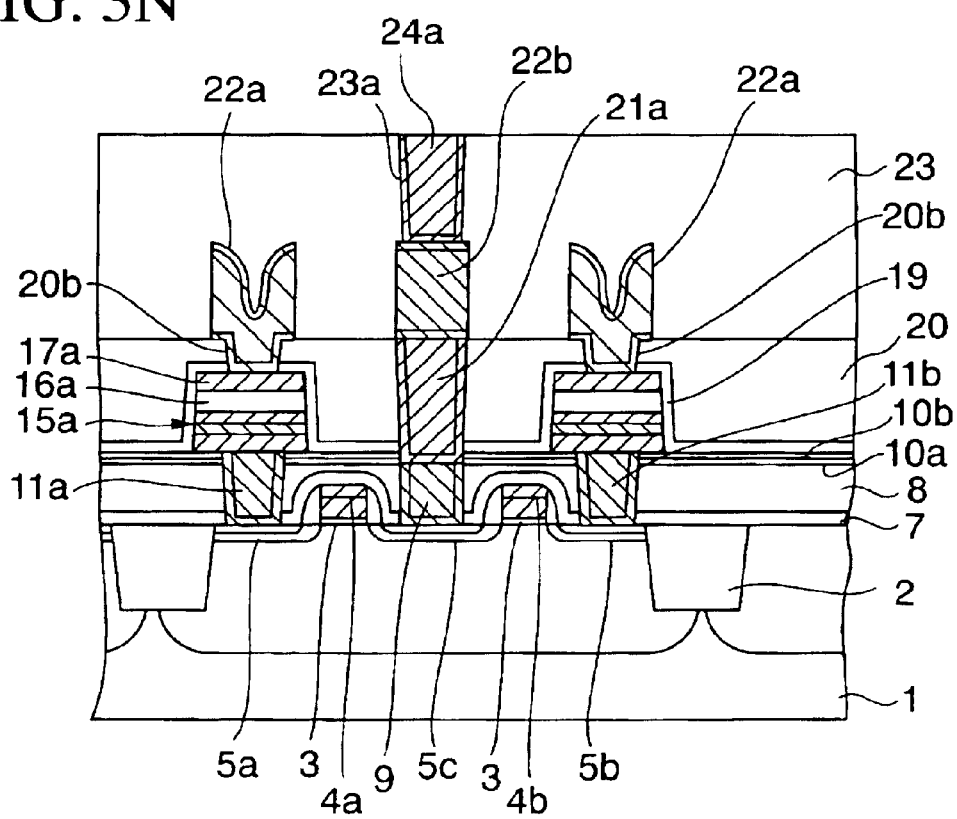

FIGS. 3A to 3N are sectional views showing steps of manufacturing a semiconductor device according to a second embodiment of the present invention.

First, as shown in FIG. 3A, in compliance with the steps shown in the first embodiment, the element isolation insulating film 2 is formed on the silicon substrate 1, then the p-well 1a is formed, then the MOS transistors $T_1$, $T_2$ are formed, then the cover insulating film 7 and the first interlayer insulating film 8 are formed, then the densifying process of the first interlayer insulating film 8 is carried out, and the upper surface of the first interlayer insulating film 8 is made flat by the CMP method.

Next, steps required until a structure shown in FIG. 3B is formed will be explained hereunder.

First, a bit-line contact hole 8c having a depth to reach the third n-type impurity diffusion region 5c is formed by patterning the first interlayer insulating film 8 and the cover insulating film 7 by means of the photolithography method. Then, a Ti film of 30 nm thickness and a TiN film of 50 nm thickness are formed sequentially as a glue film on the upper surface of the first interlayer insulating film 8 and an inner surface of the bit-line contact hole 8c by the sputter method. Then, a W film is grown on the TiN film by the CVD method using WF6 to bury perfectly an interior of the bit-line contact hole 8c.

Then, the W film, the TiN film, and the Ti film are polished by the CMP method to remove from the upper surface of the first interlayer insulating film 8. The W film, the TiN film, and the Ti film being left in the bit-line contact hole 8c is used as a first bit-line conductive plug 9.

Then, as shown in FIG. 3C, an oxidation-prevention insulating film 10a made of $Si_3N_4$ of 100 nm thickness and the underlying insulating film 10b made of $SiO_2$ of 100 nm thickness are formed sequentially on the first interlayer insulating film 8 and the first bit-line conductive plug 9 by the plasma CVD method. The $SiO_2$ film is grown by the plasma CVD method using TEOS. The oxidation-prevention insulating film 10a is formed to prevent the event that, in the heat treatment such as the later annealing, or the like, the abnormal oxidation of the first bit-line conductive plug 9 is caused to thus generate the contact failure. It is preferable that the film thickness should be set to more than 70 nm, for example.

Then, as shown in FIG. 3D, the oxidation-prevention insulating film 10a, the underlying insulating film 10b, the first interlayer insulating film 8, and the cover insulating film 7 are etched by using the resist pattern (not shown). Thus, the first and second contact holes 8a, 8b for the capacitor connection are formed on the first and second n-type impurity diffusion regions 5a, 5b respectively.

Then, the Ti film of 30 nm thickness and the TiN film of 50 nm thickness are formed sequentially as the glue film on the upper surface of the underlying insulating film 10b and the inner surfaces of the first and second contact holes 8a, 8b by the sputter method. Then, the W film is grown on the TiN film by the CVD method to bury completely the inside of the first and second contact holes 8a, 8b.

Then, as shown in FIG. 3E, the W film, the TiN film, and the Ti film are polished by the CMP method to remove from the upper surface of the underlying insulating film 10b. Thus, the W film, the TiN film, and the Ti film being left in the first and second contact holes 8a, 8b are used as first and second conductive plugs 11a, 11b for the capacitor connection respectively.

Next, steps required until a structure shown in FIG. 3F is formed will be explained hereunder.

First, the Ir film 15x of about 200 nm thickness, the $IrO_x$ film 15y of about 50 nm thickness, and the Pt film 15z of about 100 nm thickness, for example, are formed sequentially as the first conductive film 15 on the first and second conductive plugs 11a, 11b and the underlying insulating film 10b by the sputter. The first conductive film 15 may be formed of the conductive film containing other platinum-group metal or platinum-group metal oxide.

In this case, the underlying insulating film 10b is annealed to prevent the film peeling-off, for example, before or after the first conductive film 15 is formed. As the annealing method, the RTA executed in the argon atmosphere at 600 to 750° C., for example, is employed.

Then, the PZT film of about 100 nm thickness, for example, is formed as the ferroelectric film 16 on the first conductive film 15 by the sputter method. The formation of the ferroelectric film 16 is executed by the method shown in the first embodiment. Also, as the material of the ferroelectric film 16, in addition to the PZT, other PZT material such as PLCSZT, PLZT, etc., the Bi layered-structure compound material such as $SrBi_2Ta_2O_9$, $SrBi_2(Ta,Nb)_2O_9$, etc., other metal oxide ferroelectric substance, etc. may be employed.

Then, the ferroelectric film 16 is crystallized by executing the annealing in the oxygen atmosphere. As the annealing, two-step RTA process having the first step in which the annealing is executed in the mixed-gas atmosphere consisting of the argon and the oxygen at the substrate temperature of 600° C. for 90 second and the second step in which the annealing is executed in the oxygen atmosphere at the substrate temperature of 750° C. for 60 second, for example, is employed.

Then, the $IrO_2$ film of about 200 nm thickness, for example, is formed as the second conductive film 17 on the ferroelectric film 16 by the sputter method.

Then, as shown in FIG. 3G, the TiN film 18a is formed on the second conductive film 17 by the sputter method to have a thickness of about 200 nm, for example. Then, a silicon nitride (P-SIN) film 18c of 1000 nm thickness is formed by the plasma CVD method on the TiN film 18a. The P-SIN film 18c is grown by setting the pressure in the growth atmosphere to about 4.0 Torr and setting the substrate temperature to about 400° C. while using silane, ammonia, and nitrogen ($N_2$) as the source gas.

Then, the resist R is coated on the P-SIN film 18c, and then patterned such that capacitor planar shapes are formed over the first and second conductive plugs 11a, 11b for the capacitor connection respectively by exposing/developing this resist.

Then, the P-SIN film 18c formed in the region that is not covered with the resist R is etched by the dry etching using $C_4HF_3$, Ar, and $CF_4$ as the etching gas. Then, the TiN film 18a formed in the region that is not covered with the resist R is etched by the dry etching using $BCl_3$ and $Cl_2$ as the etching gas. The etching of the P-SIN film 18c and the etching of the TiN film 18a are carried out by changing the etcher.

Then, the P-SIN film 18c and the TiN film 18a, after patterned, are used as the hard mask 18. The P-SIN film 18c is the mask that is suitable for the patterning of the ferroelectric film 16. In this case, the resist R is removed by the ashing after the hard mask 18 is formed.

Then, as shown in FIG. 3H, the second conductive film 17, the ferroelectric film 16, and the first conductive film 15 formed in the region that is not covered with the hard mask 18 are etched sequentially by using the ICP etching equipment under the following conditions.

First, the $IrO_x$ film as the second conductive film 17 is etched. As the etching conditions in this case, HBr and $O_2$ are supplied to the etching chamber at a flow rate of 10 sccm and a flow rate of 40 sccm respectively, the pressure in the chamber is set to 0.4 Pa, the wafer stage temperature is set to 400° C., the source power is set to 800 watt, and the bias power is set to 700 watt. The etching of the second conductive film 17 is detected by using the end-point detector, and the over-etching is executed by about 10% of the film thickness of the upper electrode.

Then, the PZT film as the ferroelectric film 16 is etched. As the etching conditions in this case, $Cl_2$ and Ar are supplied to the etching chamber at a flow rate of 40 sccm and a flow rate of 10 sccm respectively, the pressure in the chamber is set to 0.4 Pa, the wafer stage temperature is set to 400° C., the source power is set to 800 watt, and the bias power is set to 700 watt. Also, the etching of the ferroelectric film 16 is detected by using the end-point detector, and the just-etching is executed.

Then, the Pt film 15z, the $IrO_x$ 15y, and the Ir film 15x constituting the first conductive film 15 are etched. As the etching conditions in this case, HBr and $O_2$ are supplied to the etching chamber at a flow rate of 10 sccm and a flow rate of 40 sccm respectively, the pressure in the chamber is set to 0.4 Pa, the wafer stage temperature is set to 400° C., the source power is set to 800 watt, and the bias power is set to 700 watt. The etching of the first conductive film 15 is detected by using the end-point detector, and the over-etching is executed. But the underlying insulating film 10b is seldom etched.

Accordingly, as shown in FIG. 3I, two capacitors Q are formed on the first interlayer insulating film 8 over one p-well 1a. Each of the capacitors Q has the lower electrode 15a made of the first conductive film 15, the dielectric film 16a made of the ferroelectric film 16, and the upper electrode 17a made of the second conductive film 17. The lower electrodes 15a of the capacitors Q are connected to the first and second n-type impurity diffusion regions 5a, 5b via the first and second conductive plugs 11a, 11b respectively.

The P-SIN film 18c constituting the hard mask 18 is left thick at its center portion but thin at its edge portion at a point of time when the formation of the capacitors Q is completed. The thickest portion has a thickness of about 600 nm.

Then, as shown in FIG. 3J, the P-SIN film 18c is removed by executing the etching in the down-flow equipment. As the etching conditions in this case, $CF_4$ and $N_2$ are introduced into the etching atmosphere at a flow rate of 100 sccm and a flow rate of 400 sccm respectively, and the wafer stage temperature is set to 600° C., for example. As a result, the underlying insulating film made of $SiO_2$ is hardly etched, but the P-SIN film 18c can be removed.

Then, as shown in FIG. 3K, the TiN film 18a left as the hard mask 18 is removed. As the etching conditions of the TiN film 18a, it is preferable that the isotropic etching should be employed to enhance the etching selectivity to $SiO_2$ constituting the first interlayer insulating film 8. As the etching, for example, the dry process employing the down-flow etching using the etching gas containing $CF_4$ and $O_2$, or the wet process using the mixed solution of $NH_4OH$, $H_2O_2$, and $H_2O$ is effective.

In this case, the etching of the P-SIN film 18c constituting the hard mask 18 and the etching of the TiN film 18a are executed by using separate etchers.

Then, in order to cause the ferroelectric film 16 to recover from the damage caused by the etching, the recovery annealing of the capacitors Q is carried out. The recovery annealing in this case is carried out in the oxygen atmosphere at the substrate temperature of 650° C. for 60 minute, for example.

Then, as shown in FIG. 3L, the alumina film of 50 nm thickness is formed as the capacitor protection film 19, which covers the capacitors Q, on the underlying insulating film 10b by the sputter. Then, the capacitors Q are annealed in the oxygen atmosphere at 650° C. for 60 minute.

Then, the silicon oxide ($SiO_2$) film of about 1.0 μm thickness is formed as the second interlayer insulating film 20 on the capacitor protection film 19 by the plasma CVD method using the TEOS gas. Then, the upper surface of the second interlayer insulating film 20 is planarized by the CMP method.

Next, steps required until a structure shown in FIG. 3M is formed will be explained hereunder.

First, the second interlayer insulating film 20, the capacitor protection film 19, the first interlayer insulating film 8, the underlying insulating film 10b, and the oxidation-prevention insulating film 10a are etched by using the resist mask (not shown). Thus, the third contact hole 20a is formed on the first bit-line conductive plug 9.

Then, the TiN film of 50 nm thickness is formed as the glue film in the third contact hole 20a and on the second interlayer insulating film 20 by the sputter method. Then, the W film is grown on the glue film by the CVD method to bury completely the inside of the third contact hole 20a.

Then, the W film and the TiN film are polished by the CMP method to remove from the upper surface of the second interlayer insulating film 20. Then, the tungsten film and the glue film being left in the third contact hole 20a are used as a second bit-line conductive plug 21a. This second bit-line conductive plug 21a is connected electrically to the third n-type impurity diffusion region 5c via the first bit-line conductive plug 9.

Next, steps required until a structure shown in FIG. 3N is formed will be explained hereunder.

First, the SiON film is formed as the second oxidation preventing film (not shown) on the second bit-line conductive plug 21a and the second interlayer insulating film 20 by the CVD method. Then, the contact holes 20b are formed on the upper electrodes 17a of the capacitors Q by patterning the second oxidation preventing film and the second interlayer insulating film 20 by means of the photolithography method.

The capacitors Q that are subjected to the damage in forming the contact holes 20b can be recovered by the annealing. The annealing is carried out in the oxygen atmosphere at the substrate temperature of 550° C. for 60 minute, for example.

Then, the oxidation preventing film formed on the second interlayer insulating film 20 is removed by the etching-back to expose a surface of the second bit-line conductive plug 21a.

Then, the multi-layered metal film is formed in the contact holes 20b formed on the upper electrodes 17a of the capacitors Q and on the second interlayer insulating film 20. Then, the first-layer metal wirings 22a, which are connected to the upper electrodes 17a via the contact holes 20b, and the conductive pad 22b, which is connected to the second bit-line conductive plug 21a, are formed by patterning the multi-layered metal film.

Then, the third interlayer insulating film 23 is formed on the second interlayer insulating film 20, the first-layer metal wirings 22a, and the conductive pad 22b. Then, the hole 23a is formed on the conductive pad 22b by patterning the third interlayer insulating film 23, and a third bit-line conductive plug 24a that consists of the TiN film and the W film sequentially from the bottom is formed in the hole 23a.

Then, although not particularly shown, the second-layer wirings containing the bit line are formed on the third interlayer insulating film 23. The bit line is connected electrically to the third n-type impurity diffusion region 5c via the bit-line conductive plugs 24a, 21a, and 9, and the conductive pad 22b. Subsequently to this, an insulating film for covering the second-layer wirings, etc. are formed, but their details will be omitted herein.

Next, the conditions applied to remove the P-SIN film 18c constituting the hard mask 18 will be explained hereunder.

First, the P-SIN film 18c constituting the hard mask 18 and the $SiO_2$ film constituting the underlying insulating film 10b and the first interlayer insulating film 8 are etched under the same conditions respectively. The mixed gas consisting of $CF_4$ and $N_2$ is used as the etching gas, the wafer stage temperature is set to 60° C., the pressure in the etching atmosphere is set to 133 Pa, the frequency of the plasma-generating high-frequency power supply is set to 2.65 GHz, and the power of this power supply is set to 1200 W.

Figure 4:
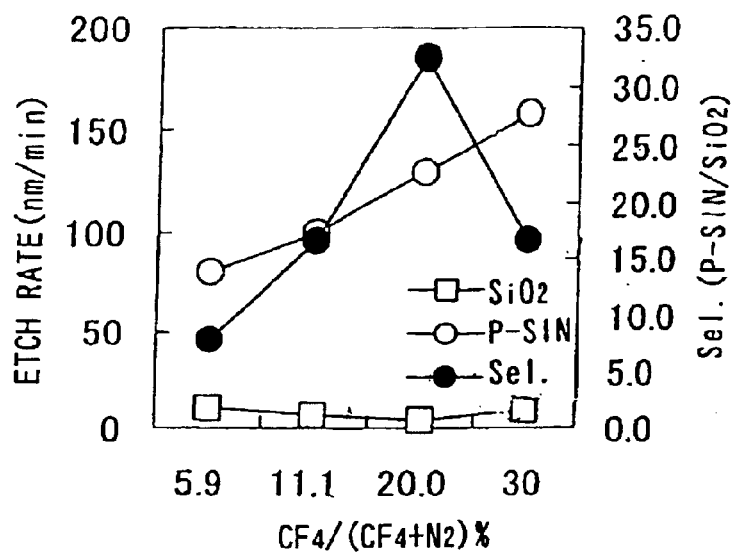
FIG. 4 is a graph showing a relationship between an etching gas mixture ratio and an etching rate at the time of etching executed to remove a P-SIN hard mask employed in the semiconductor device manufacturing method according to the second embodiment of the present invention.

When the etching rates of the P-SIN film and the $SiO_2$ film were examined by changing a gas flow rate ratio of $CF_4$ in the mixed gas consisting of $CF_4$ and $N_2$ in the range of 6 to 30 flow rate % and also their selective etching ratios were examined, the results shown in FIG. 4 were obtained. In other words, in order to execute the selective etching of the P-SIN film to the $SiO_2$ film, respective flow rates of $CF_4$ and $N_2$ are important. When a rate of $CF_4$ of the mixed gas is set to 20%, the selective etching ratio of the P-SIN film to the $SiO_2$ film become about 35 and the peak appeared in the selective etching ratio.

Figure 5:
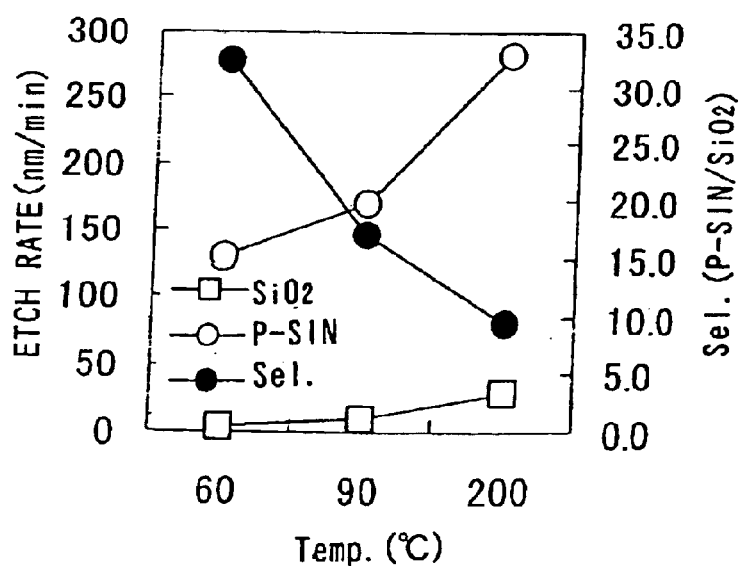
FIG. 5 is a graph showing a relationship between a wafer stage temperature and the etching rate at the time of etching executed to remove the P-SIN hard mask employed in the semiconductor device manufacturing method according to the second embodiment of the present invention.

Also, when the rate of $CF_4$ of the mixed gas consisting of $CF_4$ and $N_2$ was set to 20%, and then the etching rates of the P-SIN film and the $SiO_2$ film were examined by changing the wafer stage temperature in the range of 60 to 200° C. and also their selective etching ratios were examined, the results shown in FIG. 5 were obtained. According to FIG. 5, the selective etching ratio becomes lower as the wafer stage temperature becomes higher. The selective etching ratio exceeds about 35 when the wafer stage temperature is less than 60° C.

Accordingly, it is preferable that, in order to remove the P-SIN film 18c constituting the hard mask 18 by the etching, the wafer stage temperature should be set low such as 60° C. or less and also the rate of $CF_4$ in the mixed gas should be set to about 20±10 flow rate %.

As described above, it is possible to etch the P-SIN film selectively to the $SiO_2$ film, and it is optimal to employ the P-SIN film as the upper layer portion of the hard mask.

Figure 6:
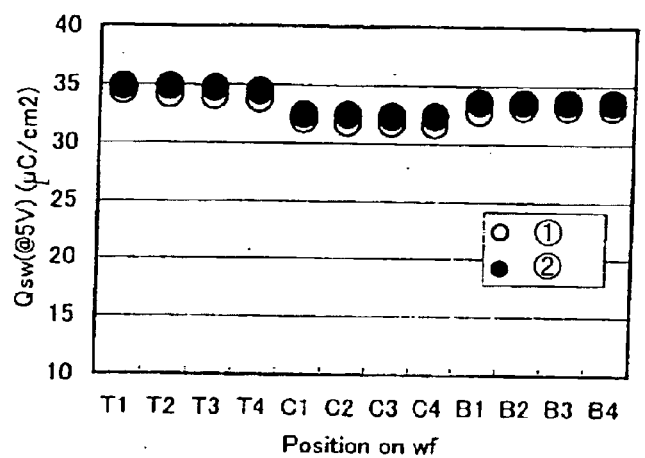
FIG. 6 is a graph showing a difference of capacitor $Q_{SW}$ values before and after the hard mask is removed, in the semiconductor device manufacturing steps according to the second embodiment of the present invention.

When the rate of $CF_4$ of the mixed gas consisting of $CF_4$ and $N_2$ was set to 20%, and the wafer stage temperature was set to 60° C., and then an amount of polarization charge $Q_{SW}$ of the capacitor at ±5 V was examined before and after the P-SIN film is removed, the results shown in FIG. 6 were obtained. It was found that no difference appears in the amount of polarization charge $Q_{SW}$ of the capacitor before and after the P-SIN film removing process and thus the deterioration of the capacitors is not caused. In this case, in FIG. 6, T1 to T4, C1 to C4, and B1 to B4 show a different position on the semiconductor wafer respectively.

By the way, when the P-SIN film of the hard mask 18 is left as the uppermost layer, as shown in FIG. 3I, at a point of time when the etching of the first conductive film 15 is ended, the hard mask 18 can be etched selectively to the underlying insulating film 10b according to the above conditions.

Figure 7:
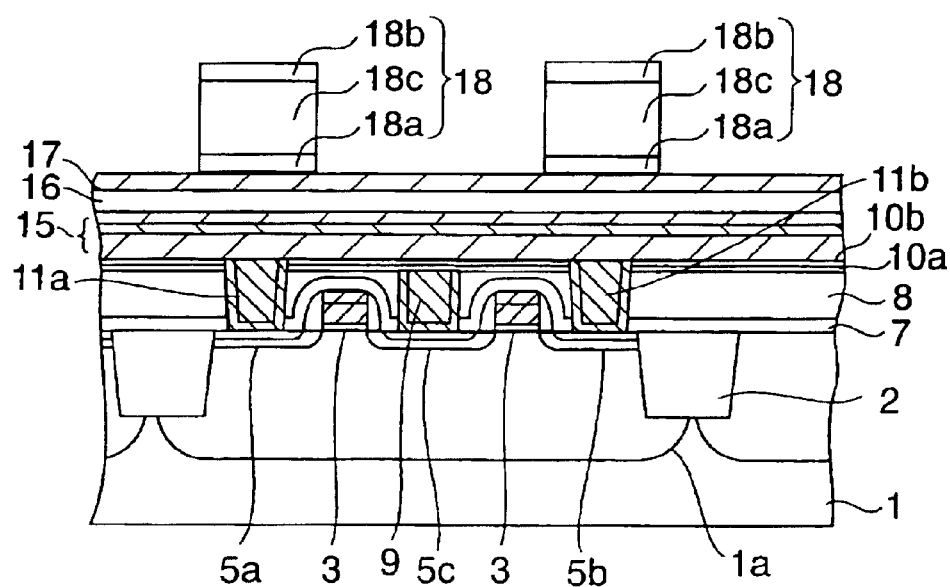
FIG. 7 is a sectional view showing another example of the semiconductor device manufacturing steps according to the second embodiment of the present invention.

Thus, as shown in FIG. 7, when the hard mask 18 is constructed by the triple-layered structure consisting of the TiN film 18a, the P-SIN film 18c, and the $SiO_2$ film 18b and also the thickness of the $SiO_2$ film 18b is adjusted, only the P-SIN film 18c and the TiN film 18a may be left as the hard mask 18 in the state that the etching of the first conductive film 15 is ended.

The hard mask 18 shown in FIG. 7 has the structure in which the TiN film 18a of 200 nm thickness, the P-SIN film 18c of 600 nm thickness, and the $SiO_2$ film 18b of 400 nm thickness, for example, are formed sequentially. The $SiO_2$ film 18b is formed by the CVD method using TEOS.

Figure 8A:
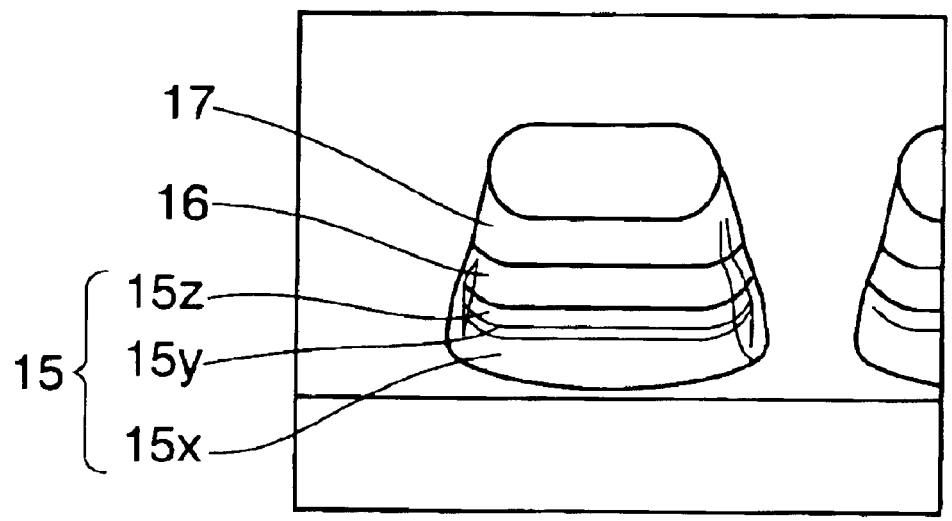
FIG. 8A is a perspective view showing a capacitor formed by using the hard mask shown in FIG. 7.
Figure 8B:
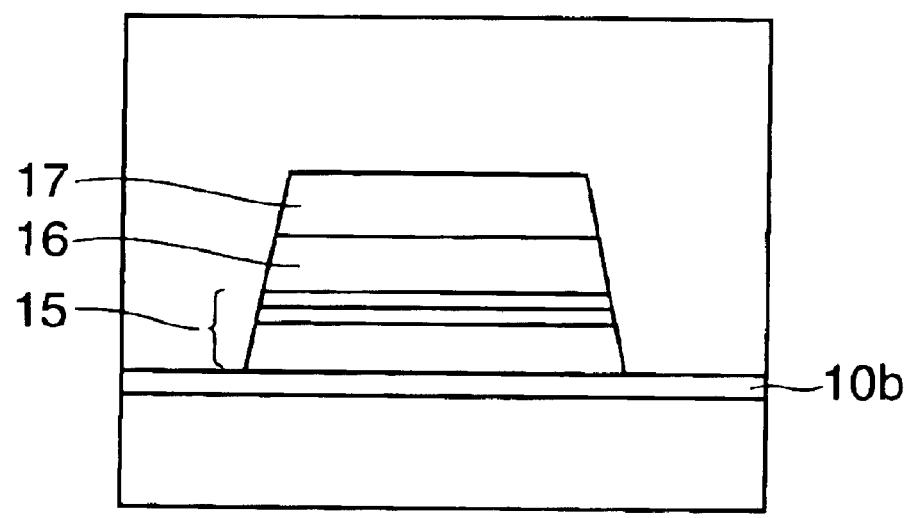
FIG. 8B is a sectional view showing the capacitor formed by using the hard mask shown in FIG. 7.

FIG. 8A is a perspective view showing the capacitor that is formed by etching the first conductive film 15, the ferroelectric film 16, and the second conductive film 17 while using the hard mask employing such triple-layered structure, base on a microphotograph. Also, FIG. 8B is a sectional view showing the same capacitor.

In this case, in above two embodiments, an insulating film that is formed by introducing the impurity into the silicon oxide film may be employed as the material constituting the interlayer insulating layer in place of the silicon oxide film. Also, a titanium compound film or a titanium film in addition to the TiN film may be employed as the lowermost layer of the above hard mask. In addition, the above film thicknesses shown in the conductive layers, the insulating films, and the dielectric layers are mere examples, and such film thicknesses are not limited to the above numerical values.

As described above, according to the present invention, the insulating material is employed as the uppermost layer of the hard mask that is used to pattern the first conductive film, the dielectric film, and the second conductive film formed on the insulating film, and then the removal of the uppermost layer is executed by interrupting the etching of the first conductive film. Therefore, when the uppermost insulating layer constituting the hard mask is removed by the etching, the underlying insulating film is never exposed, and thus the etching of the underlying insulating film of the capacitor can be suppressed.

Also, according to the present invention, the uppermost layer of the hard mask is formed of the silicon nitride, and then the capacitor is formed by etching the first conductive film, the dielectric film, and the second conductive film continuously while using this hard mask. Therefore, the uppermost insulating layer constituting the hard mask can be easily etched selectively to the insulating film after the capacitor is formed, and thus the etching of the underlying insulating film of the capacitor can be suppressed.

What is claimed is:

1. A manufacturing method of a semiconductor device comprising the steps of:
    forming an insulating film over a semiconductor substrate;
    forming sequentially a first conductive film, a dielectric film, and a second conductive film over the insulating film;
    forming a first film made of one of metal and metal compound on the second conductive film;
    forming a second film made of insulating material on the first film;
    forming a hard mask by patterning the second film and the first film into a capacitor planar shape;
    forming a capacitor upper electrode by etching the second conductive film in a region that is not covered with the hard mask;
    forming a capacitor dielectric film by etching the dielectric film in the region that is not covered with the hard mask;
    etching the first conductive film in the region that is not covered with the hard mask up to a depth that does not expose the insulating film;
    removing the second film of the hard mask by etching;
    forming a capacitor lower electrode by etching a remaining portion of the first conductive film in the region, that is not covered with the hard mask, to the end; and
    removing the first film of the hard mask by the etching.

2. The manufacturing method of a semiconductor device according to claim 1, wherein a step is formed on a side surface of the capacitor lower electrode.

3. The manufacturing method of a semiconductor device according to claim 1, wherein the second film is a silicon oxide film.

4. The manufacturing method of a semiconductor device according to claim 3, wherein the silicon oxide film is formed while using TEOS as a source gas.

5. The manufacturing method of a semiconductor device according to claim 1, wherein the insulating film is formed of one of a silicon oxide film and a silicon oxide containing film.

6. The manufacturing method of a semiconductor device according to claim 1, wherein the first film is formed of one of a titanium film and a titanium compound film.

7. The manufacturing method of a semiconductor device according to claim 1, wherein the first conductive film consists of at least one of a platinum-group metal film and a platinum-group metal oxide film.

8. The manufacturing method of a semiconductor device according to claim 1, wherein a mixed gas containing oxygen in a halogen gas is used as etching gases used to etch the first conductive film and the second conductive film respectively.

9. The manufacturing method of a semiconductor device according to claim 1, wherein the dielectric film is a ferroelectric film, and a mixed gas consisting of a halogen gas and an inert gas is used as an etching gas of the dielectric film.

10. The manufacturing method of a semiconductor device according to claim 1, wherein an impurity diffusion region is formed in a surface region of the semiconductor substrate, and further comprising the step of:
        forming a conductive plug, which is connected electrically to the impurity diffusion region and connected to upper surface of the capacitor lower electrode, in the insulating film.

11. The manufacturing method of a semiconductor device according to claim 1, wherein removal of the hard mask is carried out by down-flow etching.

12. The manufacturing method of a semiconductor device comprising the steps of:
    forming an insulating film over a semiconductor substrate;
    forming sequentially a first conductive film, a dielectric film, and a second conductive film over the insulating film;
    forming a first film made of one of metal and metal compound on the second conductive film;

forming a second film made of a silicon nitride film, which is different material from the insulating film, on the first film;

forming a hard mask by patterning the second film and the first film into a capacitor planar shape;

forming a capacitor upper electrode by etching the second conductive film in a region that is not covered with the hard mask;

forming a capacitor dielectric film by etching the dielectric film in the region that is not covered with the hard disk;

forming a capacitor lower electrode by etching the first conductive film in the region that is not covered with the hard mask;

removing the second film of the hard mask by etching using an etching gas containing fluoride and nitrogen; and removing the first film of the hard mask by the etching.

13. The manufacturing method of a semiconductor device according to claim 12, wherein the silicon nitride film is formed by a plasma CVD method.

14. The manufacturing method of a semiconductor device according to claim 12, wherein a temperature of a stage on which the semiconductor substrate is loaded is set to less than 60° C. when the second film is removed.

15. The manufacturing method of a semiconductor device according to claim 12, wherein the etching gas is a mixed gas consisting of $CF_4$ and $N_1$, and a gas flow rate ratio of $CF_4$ in the mixed gas is 20±10 flow rate %.

16. The manufacturing method of a semiconductor device according to claim 12, wherein a third film made of a silicon oxide film is formed on the first film before the first film and the second film are patterned, and the third film is patterned together with the first film and the second film to constitute a part of the hard mask.

17. The manufacturing method of a semiconductor device according to claim 16, wherein a thickness of the third film is formed into such a thickness that is removed until an etching of the first conductive film is ended.

18. The manufacturing method of a semiconductor device according to claim 12, wherein the insulating film is formed of one of a silicon oxide film and a silicon oxide containing film.

19. The manufacturing method of a semiconductor device according to claim 12, wherein the first film is formed of one of a titanium film and a titanium compound film.

20. The manufacturing method of a semiconductor device according to claim 12, wherein the first conductive film consists of at least one of a platinum-group metal film and a platinum-group metal oxide film.

21. The manufacturing method of a semiconductor device according to claim 12, wherein a mixed gas containing oxygen in a halogen gas is used as etching gases used to etch the first conductive film and the second conductive film respectively.

22. The manufacturing method of a semiconductor device according to claim 12, wherein the dielectric film is a ferroelectric film, and a mixed gas consisting of a halogen gas and an inert gas is used as an etching gas of the dielectric film.

23. The manufacturing method of a semiconductor device according to claim 12, wherein an impurity diffusion region is formed in a surface region of the semiconductor substrate, and further comprising the step of:

forming a conductive plug, which is connected to upper surface of the capacitor lower electrode, in the insulting film.

24. The manufacturing method of a semiconductor device according to claim 12, wherein removal of the hard mask is carried out by down-flow etching.

* * * * *